United States Patent [19]

Ozaki

[11] Patent Number: 5,216,266
[45] Date of Patent: Jun. 1, 1993

[54] SEMICONDUCTOR MEMORY DEVICE HAVING MEMORY CELLS FORMED IN TRENCH AND MANUFACTURING METHOD THEREFOR

[75] Inventor: Hiroji Ozaki, Hyogo, Japan

[73] Assignee: Mitsubishi Denki Kabushiki Kaisha, Tokyo, Japan

[21] Appl. No.: 682,521

[22] Filed: Apr. 9, 1991

[30] Foreign Application Priority Data

Apr. 11, 1990 [JP] Japan .................................. 2-96703
Mar. 12, 1991 [JP] Japan .................................. 3-046782

[51] Int. Cl.$^5$ ..................... H01L 29/68; H01L 29/78; H01L 29/92
[52] U.S. Cl. ................................ 257/302; 257/304; 257/67
[58] Field of Search ................... 357/23.6, 23.6 G; 257/67, 68, 70, 296, 302, 304

[56] References Cited

U.S. PATENT DOCUMENTS

| 4,751,557 | 6/1988 | Sunami et al. | 357/23.6 G |
| 4,816,884 | 3/1989 | Hwang et al. | 357/23.6 G |

FOREIGN PATENT DOCUMENTS

| 0167764 | 1/1986 | European Pat. Off. | 357/23.6 |
| 64-25466 | 1/1989 | Japan | 357/23.6 |

OTHER PUBLICATIONS

K. Sunouchi et al., "A Surrounding Gate Transistor (SGT) Cell for 64/256 Mbit DRAMs", *IEEE*, 1989, Ch. 2, pp. 23-26.
W. F. Richardson et al., "A Trench Transistor Cross--Point Dram Cell", *IEDM Technical Digest*, Dec. 1985, pp. 714-717.

*Primary Examiner*—Edward Wojciechowicz
*Assistant Examiner*—Sara W. Crane
*Attorney, Agent, or Firm*—Lowe, Price, Leblanc & Becker

[57] ABSTRACT

A semiconductor memory device includes a memory cell formed in a trench. The trench is formed by a bottom wall formed of a semiconductor substrate and a sidewall extending from the bottom wall and formed of the semiconductor substrate and an insulation layer thereon. A capacitor includes a first electrode formed in the semiconductor substrate, a dielectric film being in contact with the first electrode and formed on the bottom wall and the sidewall portion formed of the semiconductor substrate, and a second electrode formed on the dielectric film. A field effect transistor includes, a gate electrode, and second conductivity type first and second impurity regions formed in a semiconductor sidewall layer. The semiconductor sidewall layer is formed on the sidewall portion formed of the insulation layer. The gate electrode is formed on a side surface of the semiconductor sidewall layer in the trench with an insulating film interposed therebetween. An interconnection layer is formed above the gate electrode in the trench. By forming all the elements constituting the memory cell in the trench, the memory cell can be effectively miniaturized and no parasitic MOS transistor is formed. Isolation width between the memory cells can be reduced. Capacitance of the capacitor can be increased without forming a field effect transistor having an extremely short channel length.

7 Claims, 45 Drawing Sheets

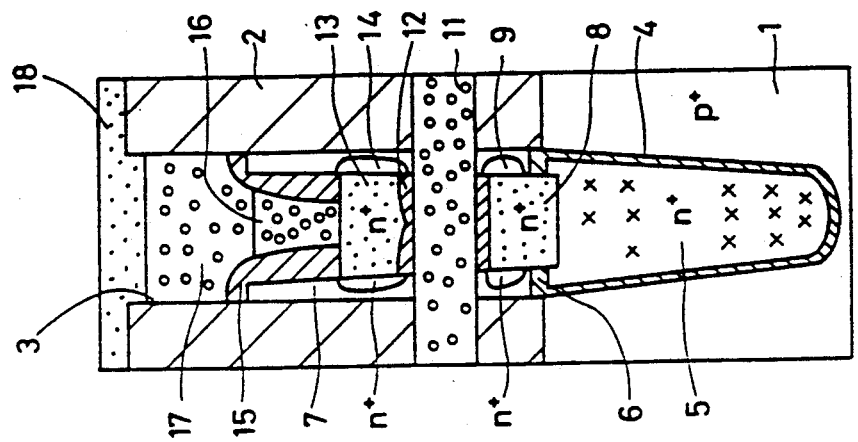
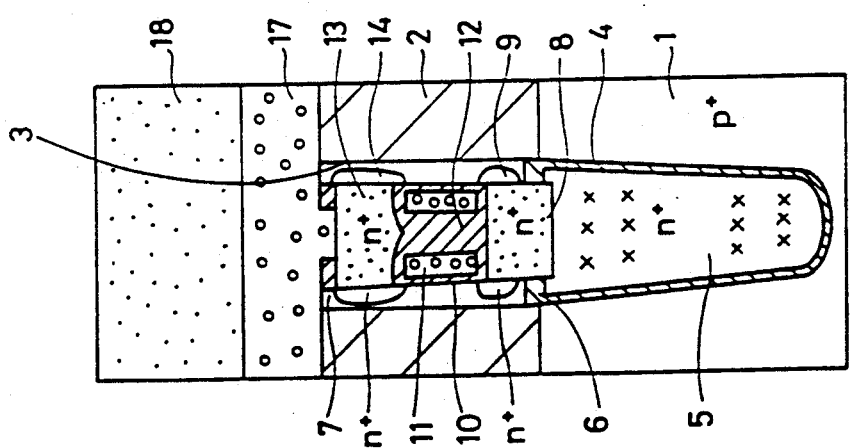

FIG. 10(A)
FIG. 10(B)
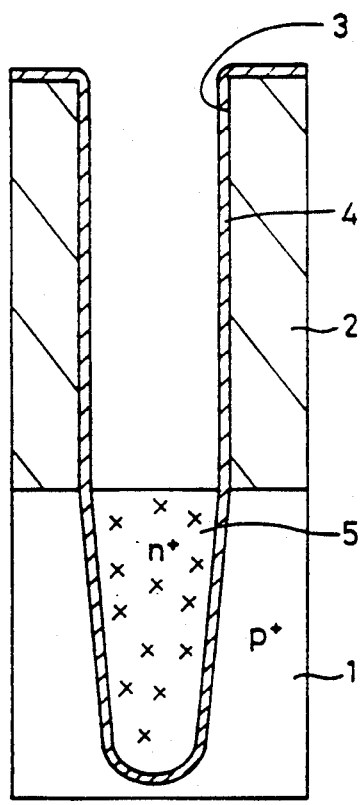
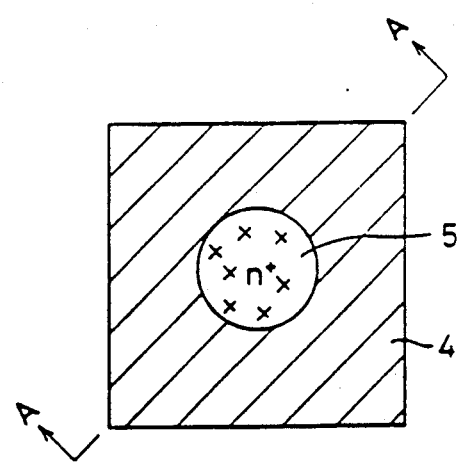

FIG. 12(A)
FIG. 12(B)
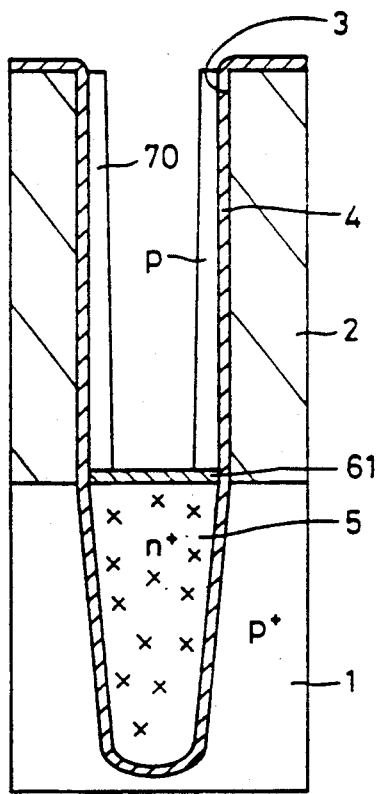
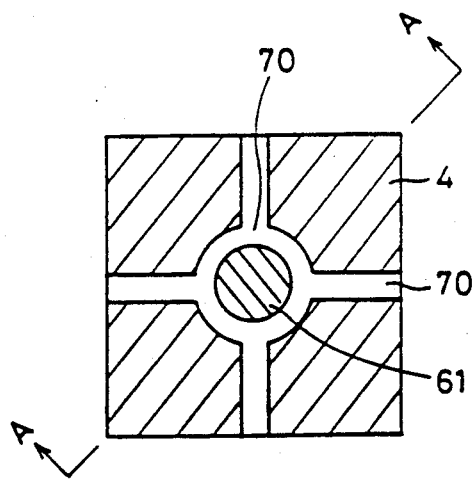

FIG. 17(A)
FIG. 17(B)
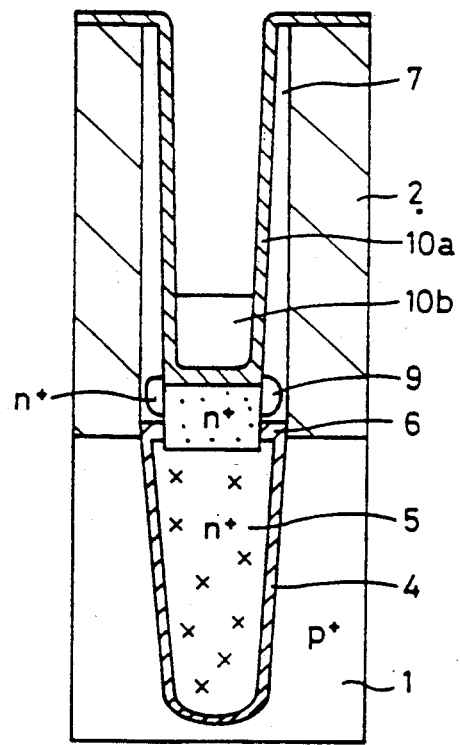
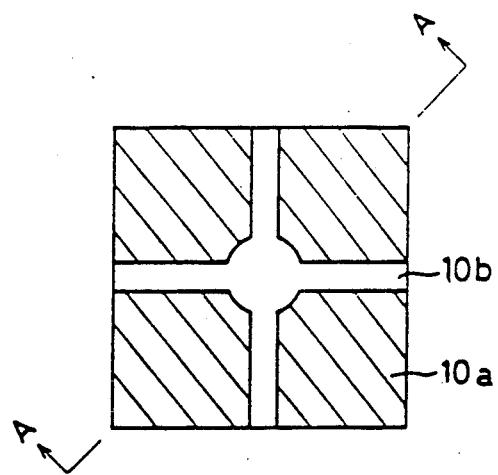

FIG. 21(A)
FIG. 21(B)
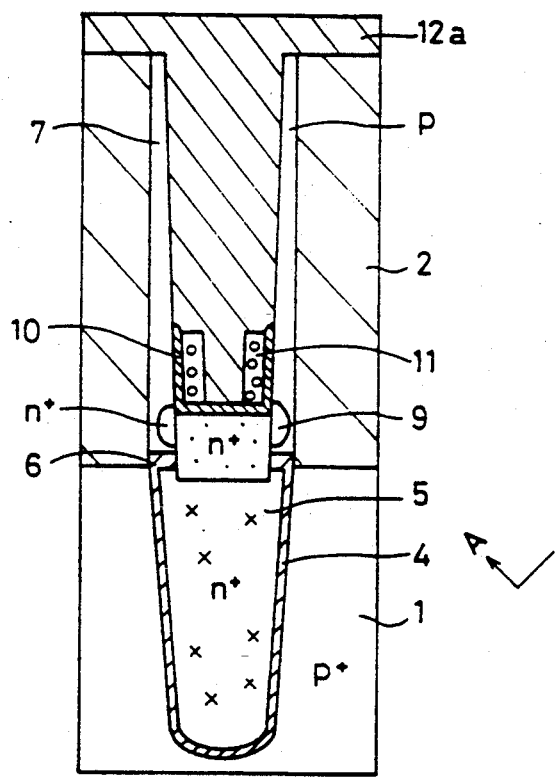
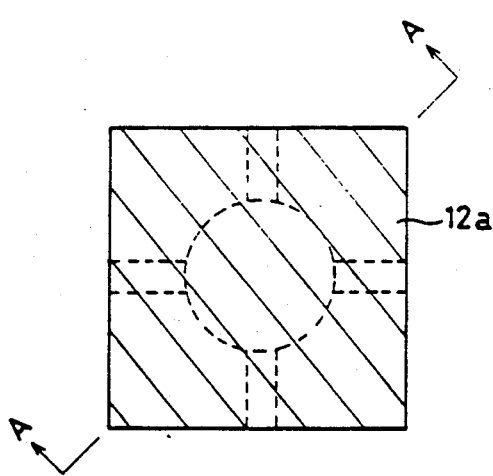

FIG. 23(A)
FIG. 23(B)
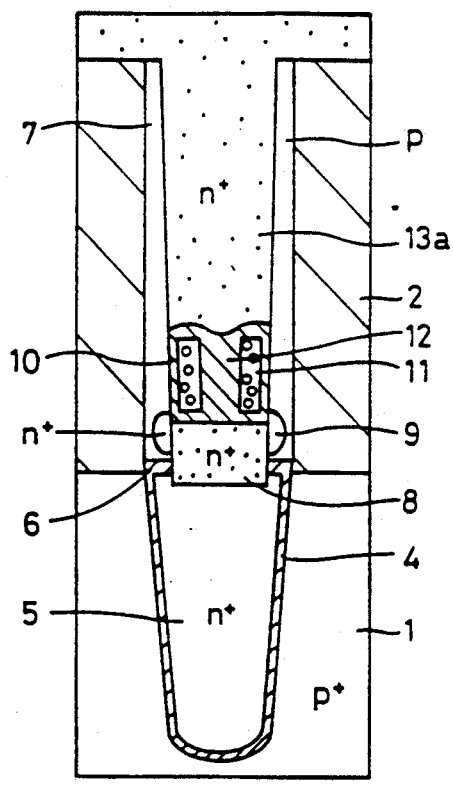
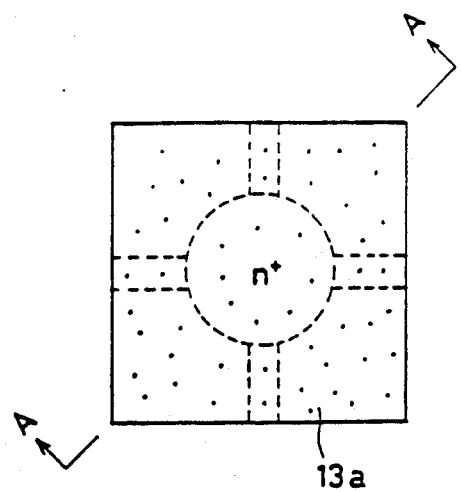

FIG. 25(A)
FIG. 25(B)
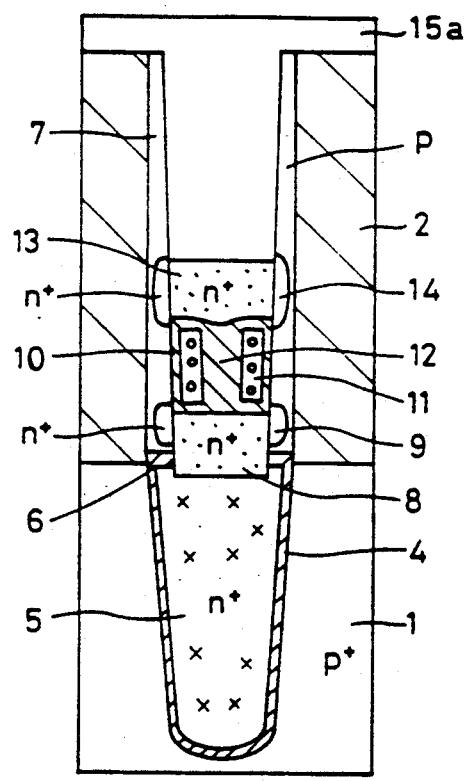
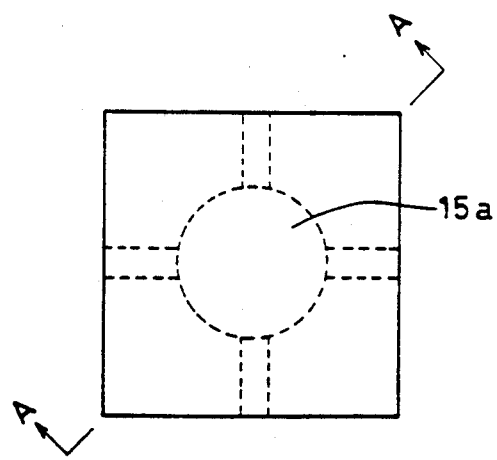

FIG. 32(A)
FIG. 32(B)
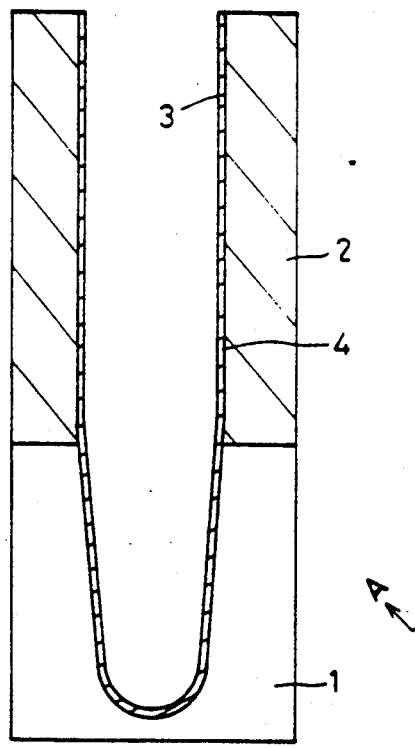
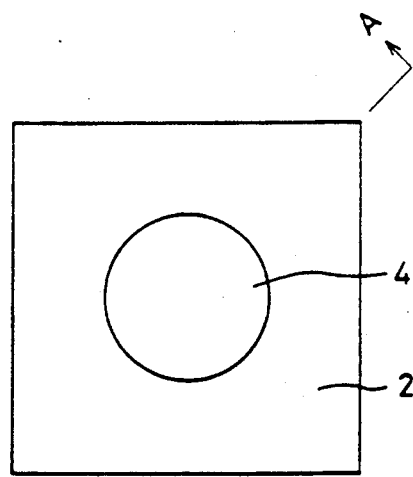

FIG. 54 PRIOR ART
FIG. 54(A)
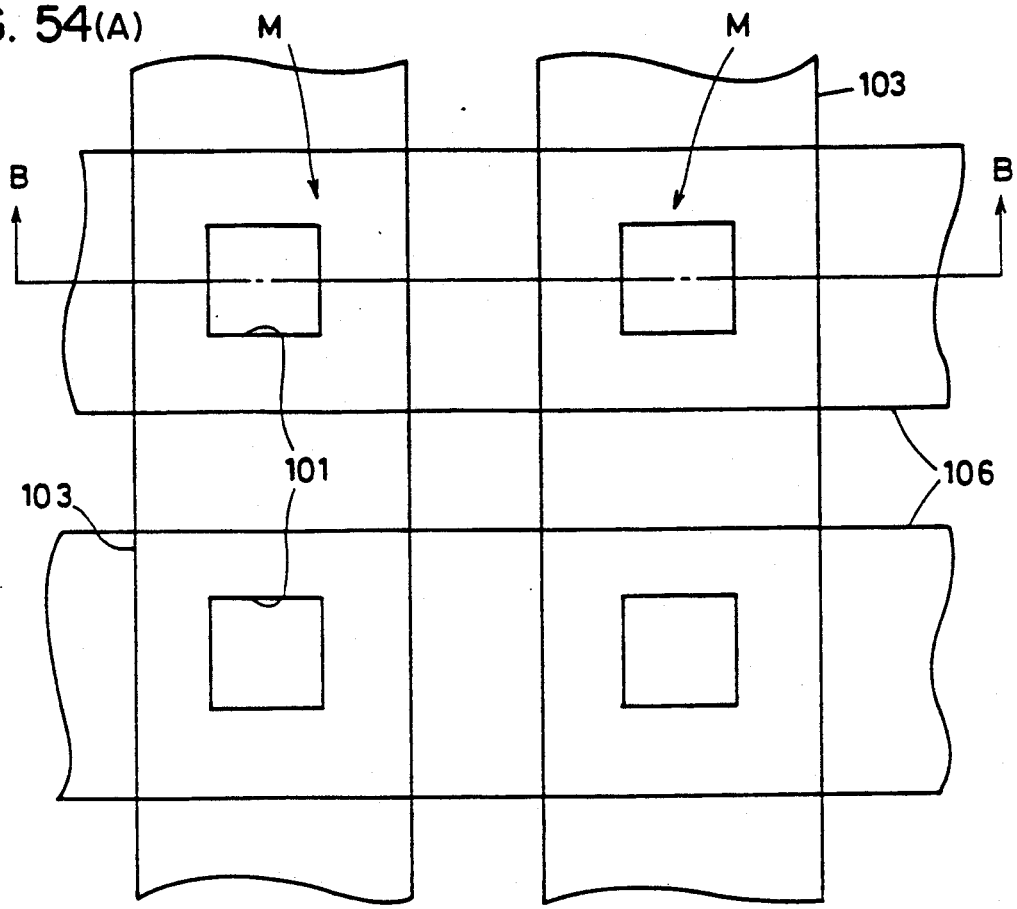
FIG. 54(B)
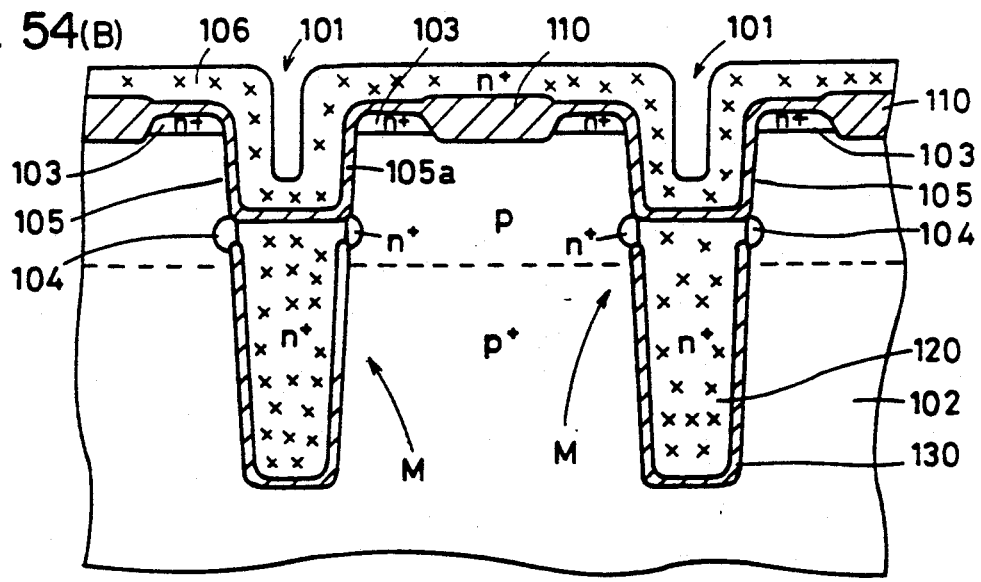

SEMICONDUCTOR MEMORY DEVICE HAVING MEMORY CELLS FORMED IN TRENCH AND MANUFACTURING METHOD THEREFOR

BACKGROUND OF THE INVENTION

1. Field of the Invention

The present invention relates generally to semiconductor memory devices and a manufacturing method therefor, and more particularly, to a semiconductor memory device having memory cells formed in trenches such as a dynamic random access memory and a manufacturing method therefor.

2. Description of the Background Art

In recent years, with a remarkable spread of information apparatuses such as computers, there is an increasing demand for semiconductor memory devices. In addition, strongly demanded is a semiconductor memory device having a large memory capacity and capable of operating at a high speed. Under these circumstances, the semiconductor memory device technique improves to achieve higher integration and higher speed response or higher reliability.

Semiconductor memory devices include a DRAM (Dynamic Random Access Memory) capable of inputting and outputting storage information at random. Generally, a DRAM comprises a memory cell array which is a storage region for storing a lot of pieces of storage information, and peripheral circuits required for inputting and outputting information to and from the outside.

FIG. 52 is a block diagram showing a structure of a common DRAM. Referring to FIG. 52, a DRAM 50 comprises a memory cell array 51, a row and column address buffer 52, a row decoder 53 and a column decoder 54, a sense refresh amplifier 55, a data-in buffer 56 and a data-out buffer 57 and a clock generator 58. The memory cell array 51 stores a data signal of storage information. The row and column address buffer 52 externally receives address signals A0-A9 for selecting memory cells forming a unit storage circuit. The row decoder 53 and the column decoder 54 designate memory cells by decoding the address signals. The sense refresh amplifier 55 amplifies and reads the signals stored in the designated memory cells. The data-in buffer 56 and the data-out buffer 57 input and output the data. The clock generator 58 generates clock signals which become control signals for the respective portions.

The memory cell array 51 occupying a large area of a semiconductor chip has a plurality of memory cells arranged in matrix for storing unit storage information. FIG. 53 is a diagram showing an equivalent circuit of 4-bit memory cells forming the memory cell array 51. The memory cell array 51 comprises a plurality of word lines WLs extending in parallel in a row direction and a plurality of bit line pairs of BL and $\overline{BL}$ extending in parallel in a column direction. Memory cells M are formed near intersecting portions between the word line WL and the bit line BL, and WL and $\overline{BL}$. The shown memory cell M comprises one MOS (Metal Oxide Semiconductor), transistor Tr and one capacitor C. Namely, each memory cell is a one-transistor one-capacitor type memory cell. Since the memory cell of this type has a simple structure, it is easy to increase the degree of integration of a memory cell array, and therefore it is widely used in large capacity DRAMs. Such structure as shown in FIG. 53 is referred to as a folded bit line arrangement in which a bit line pair of BL and $\overline{BL}$ is disposed in parallel with a sense amplifier.

Referring to FIG. 52, data is stored in N (=n×m) bit memory cell array 51. Address information of a memory cell to be read/written is stored in the row and column address buffer 52, and through a selection of a specific word line (selection of one word line among n word lines]by the row decoder 53, m-bit memory cells are connected to the sense refresh amplifiers 55 through the bit lines. Then, by selecting a specific bit line (selecting one bit line among m bit lines) by the column decoder 54, one sense refresh amplifier is connected to the input/output circuit, so that reading or writing is carried out based on the instructions of the control circuit.

Referring to FIG. 53, the MOS transistor Tr has a gate electrode connected to the word line WL, one source/drain electrode connected to one electrode of the capacitor C and the other source/drain electrode connected to the bit line BL. In data writing, application of a predetermined voltage to the word line WL renders the MOS transistor Tr conductive, so that the electric charges applied to the bit line BL are stored in the capacitor C. On the other hand, in data reading, application of a predetermined voltage to the word line WL renders the MOS transistor Tr conductive, so that the electric charges stored in the capacitor C are taken out through the bit line BL.

In recent years, a remarkable progress has been made in a semiconductor memory device and with high integration and high density thereof, miniaturization of a pattern for each semiconductor element formed therein has been accelerated. There is a strong demand for a compact and large capacity semiconductor memory device operating at a high speed. In order to meet these requirements, miniaturization of a pattern of each semiconductor element becomes indispensably necessary. In particular, a memory cell of such a DRAM as described above is a representative thereof. It is necessary to reduce a semiconductor substrate area occupied by a memory cell not only by minimizing the size of each element of a transistor, a capacitor and the like, but also by minimizing the size of a memory cell formed by these elements. In order to reduce an area occupied by the memory cell region, developments have been made in various memory cell arrangements.

For the furtherance of high integration and high density, proposed is a one-transistor one-capacitor dynamic memory cell having an elongated transistor formed on a sidewall portion of a trench for capacitor, which memory cell is disclosed in "A Trench Transistor Cross-Point DRAM Cell" in IEDM Technical Digest pp. 714–717, Dec. 1-4, 1985. According to this article, since all the memory cells are buried in trenches in this DRAM, the DRAM has the most suitable structure for reducing a memory cell area in a semiconductor substrate. FIG. 54(A) is a plan view showing such DRAM and FIG. 54(B) is a partially sectional view showing a sectional structure taken by B—B of FIG. 54(A). Referring to FIG. 54(A) an n+ impurity region 103 serving as a plurality of bit lines and a gate electrode 106 serving as a plurality of word lines are arranged orthogonally intersecting with each other. A trench 101 is formed at an intersecting portion of the bit line and the word line. Each memory cell M is formed in the trench 101. Referring to FIG. 54(B), formed is a memory cell M with each element isolated by an isolation oxide film 110 on a major surface of a p type silicon substrate 102. The memory cell M comprises an n channel MOS transistor and a capacitor. The n channel MOS transistor includes n+ impurity regions 103 and 104 forming drain/source regions, a channel region 105 provided therebetween, and a gate electrode 106 formed on the channel region 105 with a gate oxide film 105a provided therebetween. The channel region 105 is provided on an outer periphery of the gate oxide film 105a and along a sidewall portion of a trench formed in the major surface of the silicon substrate 102. The capacitor comprises a capacitor electrode 120 formed so as to be connected to the n+ impurity region 104 constituting the n channel MOS transistor, a capacitor oxide film 130 and the p type silicon substrate 102. The capacitor electrode 120 is formed of a polysilicon layer buried in the trench formed in the p type silicon substrate 102. The n+ impurity region 104 is formed into a ring-shape surrounding the capacitor electrode 120. The gate electrode 106 constituting the n channel MOS transistor is formed of an n+ polysilicon layer, which serves as a word line.

As the foregoing, in the memory cell shown in FIG. 54(B), an elongated n channel MOS transistor is formed in a sidewall portion of the trench provided for a capacitor. This is directed to reducing a plane area occupied by the n channel MOS transistor in a major surface of the substrate. It is directed to maintaining performance of the transistor, for example, by forming a channel region in a sidewall portion of a trench without making the transistor itself smaller.

However, in this structure, the isolation oxide film 110 is formed on the major surface of the silicon substrate 102 in order to isolate the respective memory cells M. In addition, the word line 106 is formed on the isolation oxide film 110. Furthermore, the n+ impurity regions 103 serving also as bit lines are formed at the opposite sides of the isolation oxide film 110. Therefore, the word line 106 formed just on the isolation oxide film 110 and the n+ impurity regions 103 formed at the opposite sides of the isolation oxide film 110 form a parasitic MOS transistor. Namely, a MOS transistor using the p type silicon substrate as a substrate, the isolation oxide film 110 as a gate insulation film and the word line 106 as a gate electrode is formed between the two n+ impurity regions adjacent to each other with the isolation oxide film 110 provided therebetween. In order to isolate the elements of each memory cell completely, the parasitic MOS transistor should be completely cut off in the range of an operation voltage of a DRAM. However, as long as the parasitic MOS transistor is formed as shown in FIG. 54(B), as a width of the isolation oxide film 110 is miniaturized below submicron order, it becomes more and more difficult to electrically isolate the memory cells. Unless this problem is overcome, it is difficult to manufacture a large capacity DRAM larger than that of 64 M bits in the future.

SUMMARY OF THE INVENTION

An object of the present invention is to further high integration and high density of a memory cell in a semiconductor memory device.

Another object of the present invention is not to form a parasitic MOS transistor along with the miniaturization of a memory cell in a memory cell arrangement.

Still another object of the present invention is to increase capacitance of a capacitor without increasing plane area occupied by memory cells.

A still further object of the present invention is to form a memory cell of high integration and high density in a dynamic random access memory.

A still further object of the present invention is to manufacture a semiconductor memory device having a memory cell of high integration and high density.

A still further object of the present invention is to manufacture a semiconductor memory device in which no parasitic MOS transistor is formed in a memory cell arrangement.

A still further object of the present invention is to manufacture a semiconductor memory device in which capacitance of a capacitor can be increased in a reduced plane area occupied by memory cells.

A semiconductor memory device in accordance with one aspect of the present invention comprises a semiconductor substrate, a trench, a capacitor and a field effect transistor buried in the trench, a first connecting conductive layer and a second connecting conductive layer. The semiconductor substrate has a major surface and it is of a first conductivity type. The trench has an upper portion extending from the major surface of the semiconductor substrate and including a sidewall, and a lower portion including a bottom wall in the semiconductor substrate. The upper wall portion of the trench includes an insulation layer. The capacitor includes a first electrode, a dielectric film and a second electrode. The first electrode is formed in the semiconductor substrate. The dielectric film is formed on a surface of the lower portion of the trench so as to be in contact with the first electrode. The second electrode is formed on the dielectric film. The field effect transistor includes a semiconductor layer of the first conductivity type, a gate electrode and first and second impurity regions of a second conductivity type. The semiconductor layer is formed on a sidewall surface of the insulation layer so as to be insulated from the second electrode and the major surface of the semiconductor substrate. The gate electrode is formed on a sidewall surface of the semiconductor layer with an insulating film interposed therebetween. The first and the second impurity regions are formed spaced apart from each other in the semiconductor layer with the gate electrode provided therebetween. The first connecting conductive layer is provided between the second electrode and the gate electrode and insulated from the gate electrode so as to electrically connect the first impurity region with the second electrode. The second connecting conductive layer includes a first portion and a second portion. The first portion is insulated from the semiconductor layer and formed above the gate electrode in the trench. The second portion is provided between the gate electrode and the first portion and insulated from the gate electrode so as to electrically connect the second impurity region with the first portion.

A semiconductor memory device in accordance with another aspect of the present invention includes a semiconductor substrate of a first conductivity type, a plurality of memory cells and isolating means. The semiconductor substrate has a major surface. The plurality of memory cells are formed respectively in a plurality of trenches extending from the major surface of the semiconductor substrate. Each memory cell includes a capacitor and a field effect transistor formed along the sidewall of the trench. The isolating means is formed only on the sidewall of the trench so as to isolate the memory cell from the other memory cells in the semiconductor substrate.

A semiconductor memory device in accordance with a further aspect of the present invention includes a semiconductor substrate of a first conductivity type, a plurality of memory cells, a bit line and isolating means. The semiconductor substrate has a major surface. The plurality of memory cells are formed respectively in a plurality of trenches extending from the major surface of the semiconductor substrate. Each memory cell includes a capacitor and a field effect transistor formed along the sidewall of the trench. The field effect transistor includes source and drain regions and a gate electrode. The source and drain regions are spaced apart from each other along the sidewall of the trench. The gate electrode are provided between the source and drain regions and electrically insulated therefrom to form a word line positioned on the sidewall. The bit line is connected to the source or drain region of the field effect transistor in the trench. The isolating means is formed only on the sidewall of the trench so as to isolate the memory cell from the other memory cells.

According to a manufacturing method of a semiconductor memory device according to the present invention, first, an insulation layer is formed on a major surface of a semiconductor substrate of a first conductivity type. By selectively removing the semiconductor substrate and the insulation layer, a trench is formed having a bottom wall formed of the semiconductor substrate and a sidewall extending from the bottom wall and formed of the semiconductor substrate and the insulation layer. A dielectric film is formed on the bottom wall and the sidewall portion formed of the semiconductor substrate. A capacitor electrode is formed on the dielectric film. A semiconductor sidewall layer of the first conductivity type is formed on the sidewall portion of the insulation layer so as to be insulated from the capacitor electrode. A first connecting conductive layer including the second conductivity type impurities is formed on the capacitor electrode so as to be in contact with the capacitor electrode and the semiconductor sidewall layer. A first impurity region of the second conductivity type is formed by doping the second conductivity type impurities from the first connecting conductive layer into the semiconductor sidewall layer. A gate electrode is formed on a side surface of the semiconductor sidewall layer in the trench with an insulating film interposed therebetween, so as to be insulated from the first connecting conductive layer near the first impurity region. A second connecting conductive layer including the second conductivity type impurities is formed near the gate electrode, insulated from the same, so as to be in contact with the region of the semiconductor sidewall layer spaced apart from the first impurity region with the gate electrode provided therebetween. A second impurity region of the second conductivity type is formed by doping the second conductivity type impurities from the second connecting conductive layer into the semiconductor sidewall layer. An interconnection layer is formed insulated from the semiconductor sidewall layer so as to be in contact with the second connecting conductive layer.

According to a preferred embodiment of the present invention, the second electrode includes the second conductivity type conductive layer filling the trench portion formed by the bottom wall and the sidewall portion formed of the semiconductor substrate. The gate electrode includes a rough cylinder-shaped or rough column-shaped conductive layer portion having an outer peripheral portion along the side surface of the semiconductor layer.

According to a preferred embodiment of the present invention, a dynamic random access memory comprises a semiconductor substrate of a first conductivity type, an insulation layer, a plurality of word lines, a plurality of bit lines and a plurality of memory cells. The word lines are formed insulated from the semiconductor substrate to extend in a first direction on a major surface of the semiconductor substrate. The bit lines are formed on the word lines to extend in a second direction intersecting with the first direction. The memory cells are arranged at intersecting portions between the word lines and the bit lines. Each of the memory cells comprises a capacitor and a field effect transistor buried in a trench. A gate electrode is connected to the word lines. Each of the bit lines includes an interconnection layer portion formed above the gate electrode in the trench, and isolated from the semiconductor sidewall layer. The second connecting conductive layer is formed between the gate electrode and the interconnection layer portion, isolated from the gate electrode, so as to electrically connect a second impurity region with the interconnection layer portion.

According to a preferred manufacturing method of a semiconductor memory device according to the present invention, after forming in insulating film on the capacitor electrode, the semiconductor sidewall layer is formed on the insulating film. An opening is formed in the insulating film so as to expose a part of a surface of the capacitor electrode, and the first connecting conductive layer is formed as a conductive layer including second conductivity type impurities so as to be in contact with the capacitor electrode through the opening. After an insulating film is formed on the first connecting conductive layer and on a part of the side surface of the semiconductor sidewall layer, a gate electrode is formed on the insulating film. After forming an insulating layer so as to cover a surface of the semiconductor sidewall layer and expose only a surface of the second connecting conductive layer, the interconnection layer is formed on the insulating layer.

In the present invention, a capacitor is formed by the first electrode and the second electrode opposing to each other along the bottom wall and the sidewall portion both formed of the first conductivity type semiconductor substrate. Therefore, capacitance of the capacitor can be easily changed depending on a depth of the trench formed in the semiconductor substrate. In addition, the first conductivity type semiconductor layer is formed along the sidewall portion formed of the insulation layer. The gate electrode is formed on the side surface of the semiconductor layer. Therefore, the channel regions are formed in a vertical direction, so that a field effect transistor having an extremely short channel length is not formed. In this case, the gate electrode exists in the trench surrounded by the sidewall portion formed of the insulation layer. Furthermore, the conductive layer connected to the second impurity region of the field effect transistor is formed in the trench. As a result, no parasitic MOS transistor with the interconnection layer as the gate electrode is formed on the major surface of the semiconductor substrate, unlike in a conventional example. This enables a width for isolating the memory cells to be reduced to the limits of the patterning, that is, down to about 0.1 $\mu$m (1000 Å).

Accordingly, with the present invention, a fine element isolation can be realized, formation of a field effect transistor having an extremely short channel length can be prevented and a semiconductor memory device without a parasitic MOS transistor can be obtained.

As the foregoing, according to the present invention, formation of all the elements constituting a memory cell of a semiconductor memory device in a trench enables a fine element isolation and prevents formation of a parasitic MOS transistor. In addition, it is possible to miniaturize a memory cell while no transistor having an extremely short channel length is formed, so that a capacitor of large capacitance can be formed depending on a depth of the trench. Furthermore, in a manufacturing method of a memory cell, all the films can be formed in a self-alignment manner only by registering masks with a corresponding pattern of a trench to be formed, so that a margin required for registering the masks without misalignments is not extremely reduced along with miniaturization of a memory cell. It is possible to obtain a memory cell which is easily miniaturized and is highly reliable.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a sectional view showing a sectional structure taken along the line III—III of FIG. 1.

FIG. 4 is a sectional view showing a sectional structure taken along the line IV—IV of FIG. 1.

FIGS. 7-31 are sectional views (A) and plan views (B) showing sequential steps of a memory cell manufacturing method according to a first embodiment of the present invention.

FIG. 32-51 are sectional views (A) and plan views (B) showing sequential steps of a memory cell manufacturing method according to a second embodiment of the present invention.

FIG. 54 shows a partial plan view (A) showing a plane arrangement and a partial sectional view showing a sectional arrangement taken along line B—B in (A) of prior art small scaled memory cell.

DESCRIPTION OF THE PREFERRED EMBODIMENTS

Figure 1:
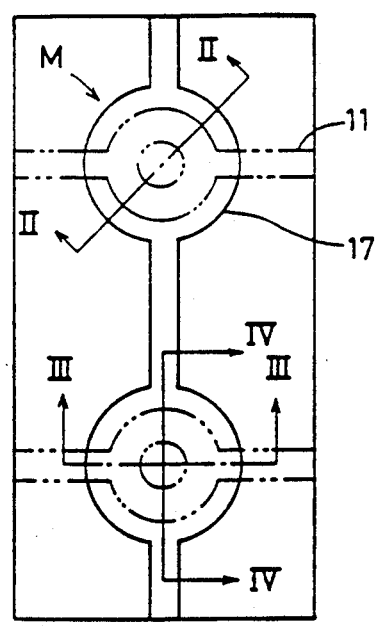
FIG. 1 is a partial plan view showing plane arrangement of memory cells according to the present invention.

FIG. 1 shows an arrangement of two memory cells. A bit line 17 is arranged to orthogonally intersect with a word line 11. A memory cell M is disposed at an intersecting portion between the word line 11 and the bit line 17.

Figure 2A:
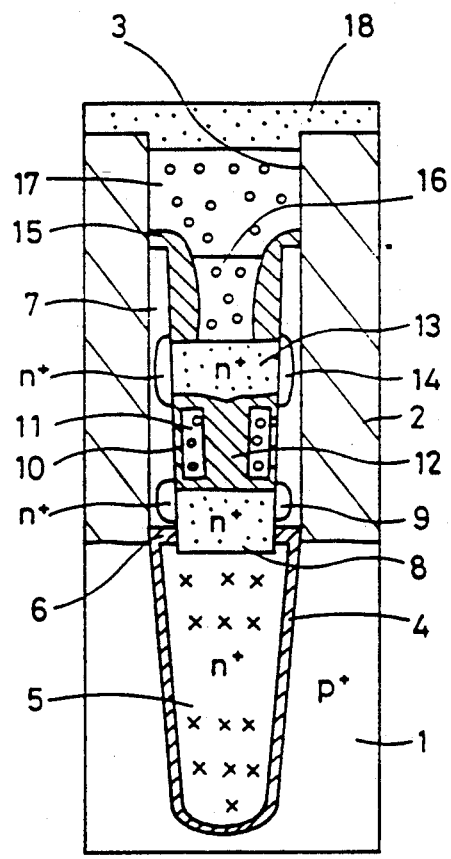
FIG. 2 is a sectional view showing two embodiments (A) and (B) of a sectional structure taken along the line II—II of FIG. 1.

Referring to FIG. 2(A), an insulating film 2 formed of a thick silicon oxide film or the like is formed on a p+ silicon substrate 1. A trench 3 is formed in the silicon substrate 1 and the insulating film 2. A nitride film 4 is formed on surfaces of a bottom wall and sidewall portions of the trench formed in the silicon substrate 1. An n+ polysilicon layer 5 is formed on the nitride film 4 so as to fill the trench formed in the silicon substrate 1. The capacitor is formed by the p+ silicon substrate 1 as a cell plate, the nitride film 4 as a capacitor dielectric film and the n+ polysilicon layer 5 as a storage node.

An insulating film 6 is formed on the n+ polysilicon layer 5. A cylindrical p type semiconductor layer 7 is formed on the insulating film 6 along a sidewall portion formed of the insulating film 2. N+ impurity regions 9 and 14 to serve as source/drain regions are formed spaced apart from each other in the p type semiconductor layer 7. A ring-shaped gate electrode 11 is formed on a side surface of the p type semiconductor layer 7 between the n+ impurity regions 9 and 14. The gate electrode 11 is formed on the side surface of the p type semiconductor layer 7 with a gate insulating film 10 provided therebetween. An n+ layer 8 is formed as an interconnect layer for electrically connecting the n+ impurity region 9 forming a source/drain region and the n+ polysilicon layer 5 forming the storage node. The n+ layer 8 is connected to the n+ polysilicon layer 5 through the opening formed in the insulating film 6 on the n+ polysilicon layer 5. The field effect transistor comprises the gate electrode 11 and the n+ impurity regions 9 and 14. An n layer 13 is formed so as to be in contact with the n+ impurity region 14 as a source/drain region. The n+ layer 13 and the gate electrode 11 are insulated by the insulating film 12. A silicon oxide film 15 is formed covering an upper portion of the sidewall of the p type semiconductor layer 7. A tungsten plug layer 16 is formed as an interconnect layer for electrically connecting the n+ layer 13 and a bit line 17. A passivation film 18 is formed on the bit line 17 so as to cover an upper portion of the trench 3.

Figure 2B:
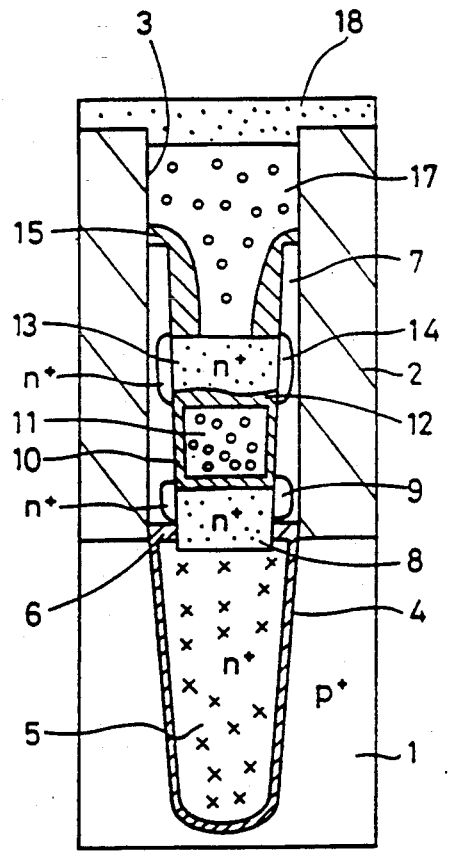

As shown in FIG. 2(B), the gate electrode 11 is formed into a column shape with the gate insulating film 10 provided on the sidewall of the p type semiconductor layer 7. The tungsten bit line 17 may be formed to be directly connected to the n+ layer 13 without the tungsten plug layer 16 provided therebetween.

In the sectional structure shown in FIG. 3, the word line 11 serving also as a gate electrode is formed extending outside the sidewall of the trench 3. That is, as shown by the two dot chain line of FIG. 1, the word line 11 is formed as a ring-shaped or column-shaped gate electrode inside the trench 3 and it is formed as an interconnection layer extending in a predetermined direction outside the trench.

In the sectional structure shown in FIG. 4, the bit line 17 is formed extending outside the trench 3. That is, as shown in FIGS. 1 and 2(A), the bit line 17 is located in a region surrounded by the sidewall of the insulating film 2 inside the trench and it is formed as an interconnection layer along a predetermined direction in the outside of the trench 3.

Figure 5:
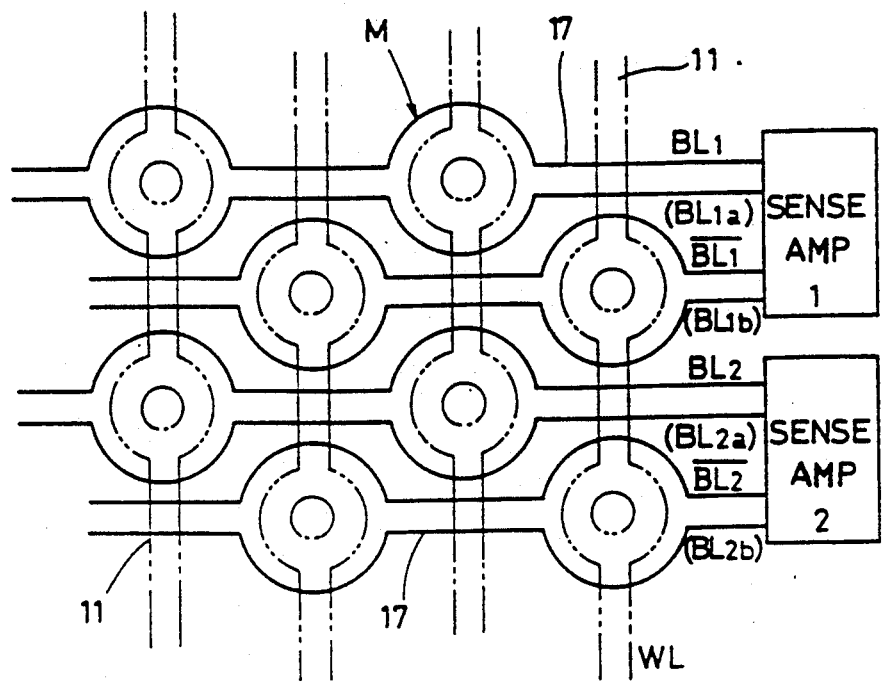
FIG. 5 is a plan view showing a plane arrangement according to a folded bit line arrangement of memory cells according to the present invention.
Figure 6:
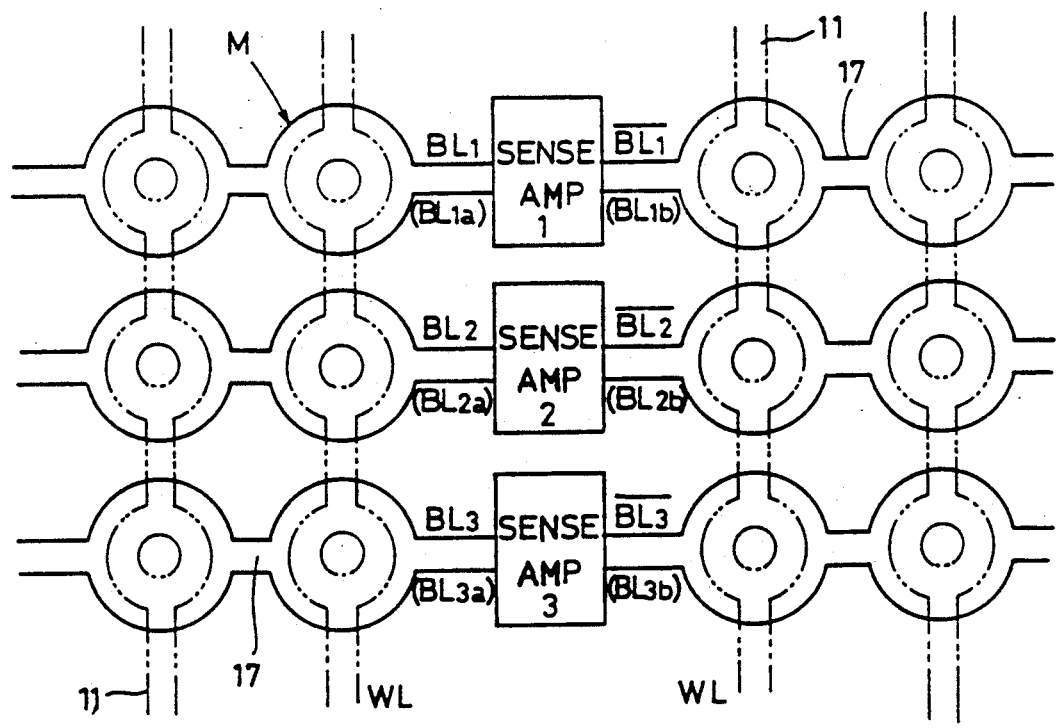
FIG. 6 is a plan view showing a plane arrangement according to an open bit line arrangement of memory cells according to the present invention.

With reference to FIG. 5, paired bit lines $\overline{BL}$ and $\overline{BL}$ are arranged in parallel to each other with respect to a sense amplifier. A memory cell M is arranged at every other cross-over points between the respective bit lines $\overline{BL}$ and $\overline{BL}$ and word lines WL. With reference to FIG.

6, paired bit lines $\overline{BL}$ and $\overline{BL}$ extend in opposite directions with a sense amplifier provided therebetween. A memory cell M is arranged at each of the cross-over points between the respective bit lines $\overline{BL}$ and $\overline{BL}$ and the word lines WL.

A manufacturing method of a memory cell of a DRAM according to the present invention will be described in detail. FIGS. 7-31 are sectional views (A) and plan views (B) of the sectional arrangement shown in FIG. 2 (A) showing sequential steps of a manufacturing method of a memory cell according to the present invention. Each sectional view (A) shows a section taken along line A—A of each plan view (B).

Figure 7A:
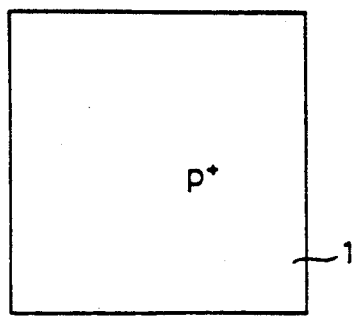
Figure 7B:
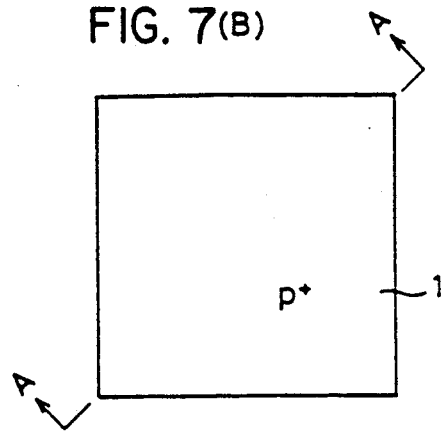
Figure 8A:
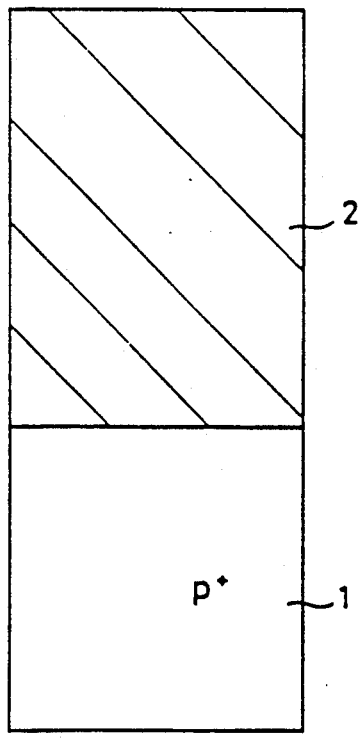
Figure 8B:
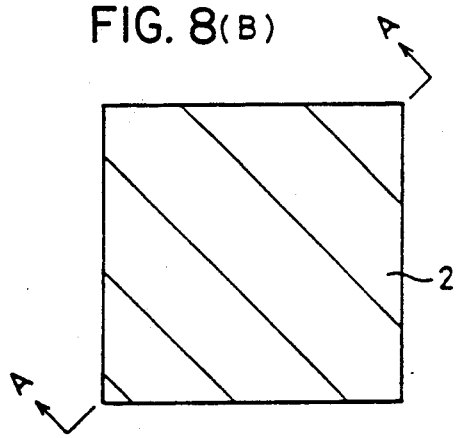

Referring to FIGS. 7(A) and 7(B), a p+ silicon substrate 1 having a concentration of about $10^{20}/cm^3$ is prepared. Then, referring to FIGS. 8(A) and 8(B), an insulating film 2 of a silicon oxide film or the like having a film thickness of about 5 μm is formed on the p+ silicon substrate 1 by the CVD method.

Figure 9A:
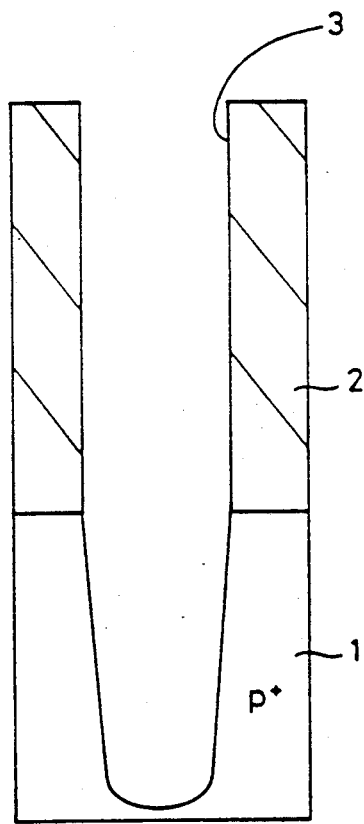
Figure 9B:
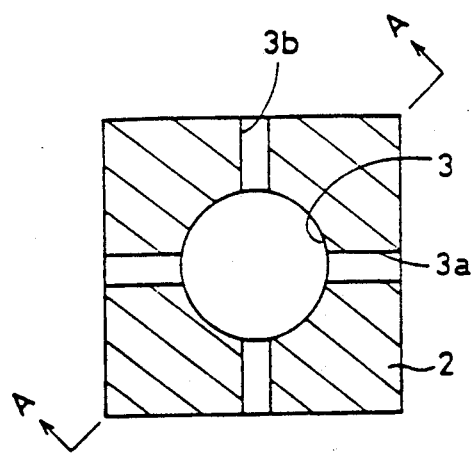

Referring to FIGS. 9(A) and 9(B), a trench 3 having a diameter of about 1 μm is formed by selectively removing the insulating film 2 and the p+ silicon substrate 1 by the reactive ion etching. At this time, a depth of the trench formed in the p+ silicon substrate 1 is about 3 μm. In addition, as shown in FIG. 9(B), a trench 3a for forming a word line and a trench 3b for forming a bit line both extending outside the trench 3 are formed by selectively removing only the insulating film 2. That is, a major surface of the p+ silicon substrate 1 is exposed at the trench portions 3a and 3b.

Referring to FIGS. 10(A) and 10(B), a nitride film 4 having a film thickness of about 50 Å is formed on a bottom wall and a sidewall surface of the p+ silicon substrate 1 and the insulating film 2 by the CVD method. Then, after a polysilicon layer 5 having n type impurity concentration of about $10^{20}$–$10^{21}/cm^3$ is formed over the whole surface, an n+ polysilicon layer 5 as a storage node is selectively removed by anisotropic etching technique such as the reactive ion etching to be left only on the surface of the nitride film 4 on the p+ silicon substrate 1. These steps are performed by using a mask having a pattern corresponding to the trench 3. In this case, while polysilicon is used as a material of the storage node, a tungsten layer may be selectively formed on the nitride film 4.

Figure 11A:
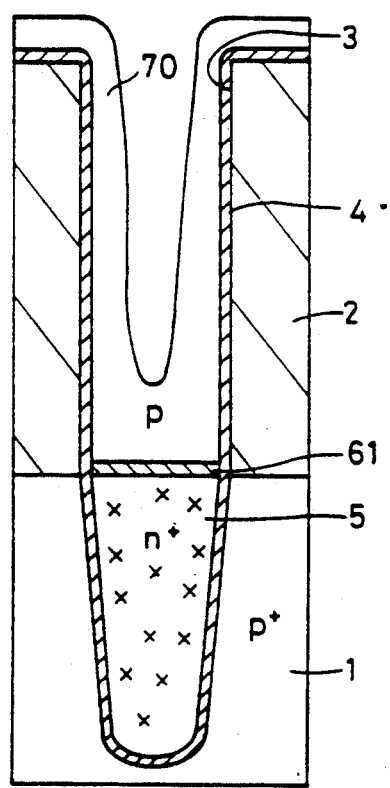
Figure 11B:
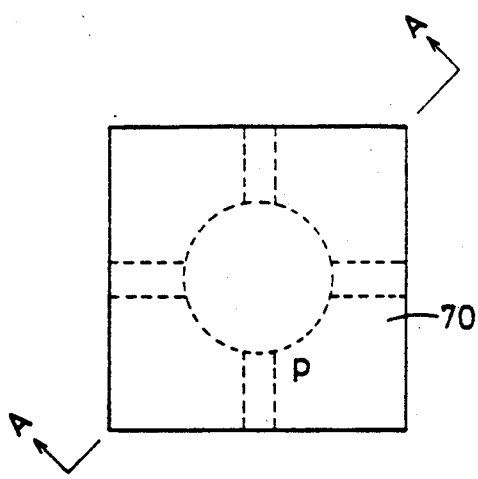
Figure 13A:
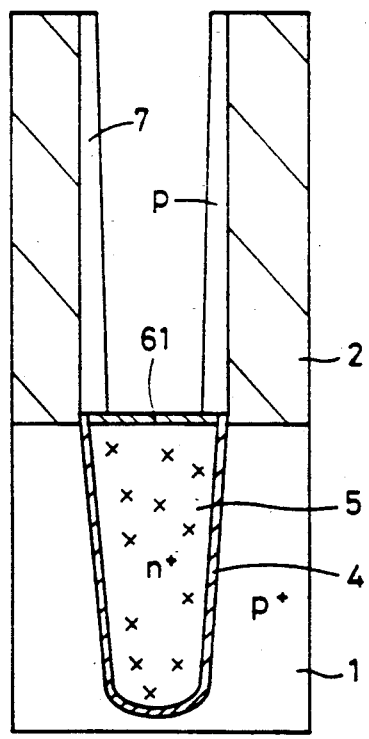
Figure 13B:
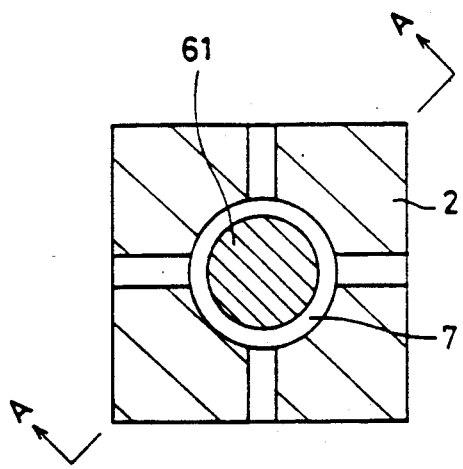

Referring to FIGS. 11(A) and 11(B), a silicon oxide film 61 having a film thickness of about 2000 Å is formed on the n polysilicon layer 5 by a thermal oxidation process or a CVD method. Thereafter, a p type polysilicon layer 70 having an impurity concentration of about $10^{16}$–$10^{17}/cm^3$ is formed on the nitride film 4 and the silicon oxide film 61 by a CVD method. Then, as shown in FIGS. 12(A) and 12(B), the p type polysilicon layer 70 is selectively removed by anisotropic etching without using any mask so as to be left on the sidewall surface of the nitride film 4. Reactive ion etching or the like by using a pattern corresponding to the trench as a mask is further carried out to selectively remove the p type polysilicon layer to be left only on the sidewall surface of the nitride film 4 in the trench. As a result, the p type polysilicon layer having a film thickness of about 1000 Å is formed on the sidewall surface of the insulating film 2. This p type polysilicon layer is recrystallized through a thermal process such as laser annealing and lamp annealing, thereby forming a p type semiconductor layer 7 as shown in FIGS. 13(A) and 13(B) (the nitride film 4 on the insulating film 2 is omitted in the drawing).

Figure 14A:
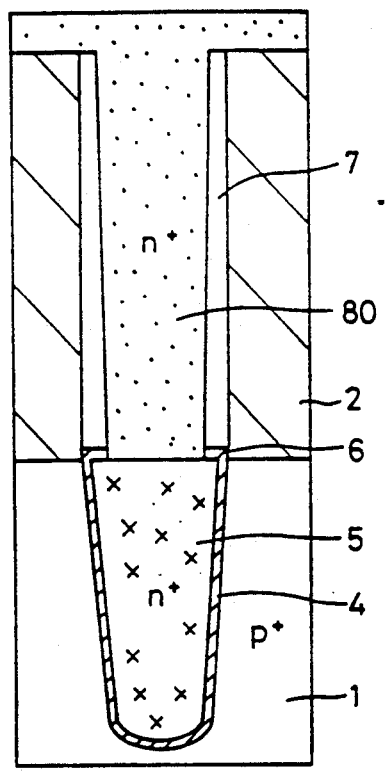
Figure 14B:
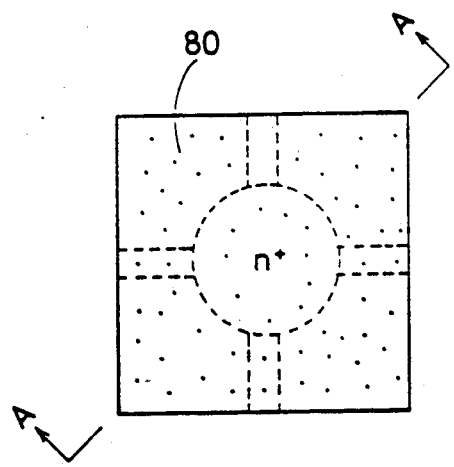
Figure 15A:
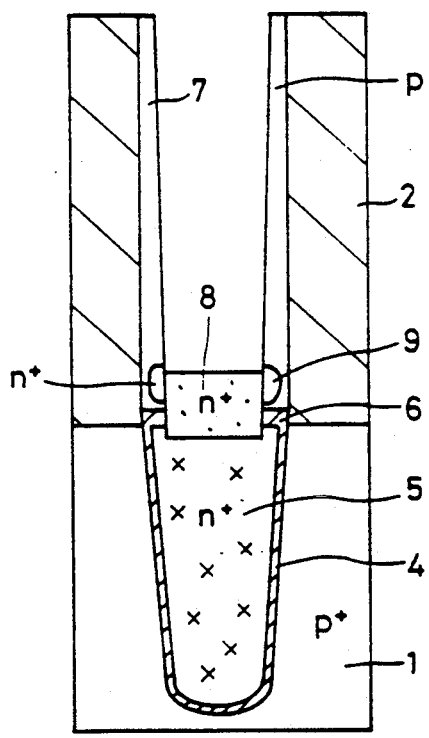
Figure 15B:
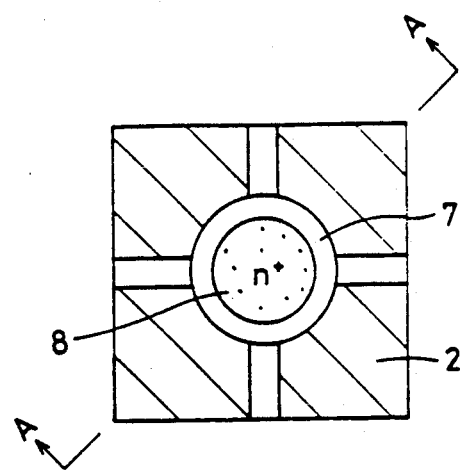

Referring to FIGS. 14(A) and 14(B), an opening portion is formed in an insulating film 6 in a self-alignment manner so as to expose the surface of the n polysilicon layer 5. Thereafter, an n layer 80 having impurity concentration of $10^{21}/cm^3$ or more is formed as a diffusion source of n type impurities over the whole surface. By selectively removing the polysilicon layer 80 by the reactive ion etching or the like, an n+ layer 8 is formed in contact with the n+ polysilicon layer 5 through the opening portion, as shown in FIGS. 15(A) and 15(B). By annealing the n layer 8, n+ type impurities diffuse into the p type semiconductor layer 7. As a result, an n+ impurity region 9 is formed. The impurity concentration of the n+ impurity diffusion region 9 is approximately $10^{19}$–$10^{20}/cm^3$.

Figure 16A:
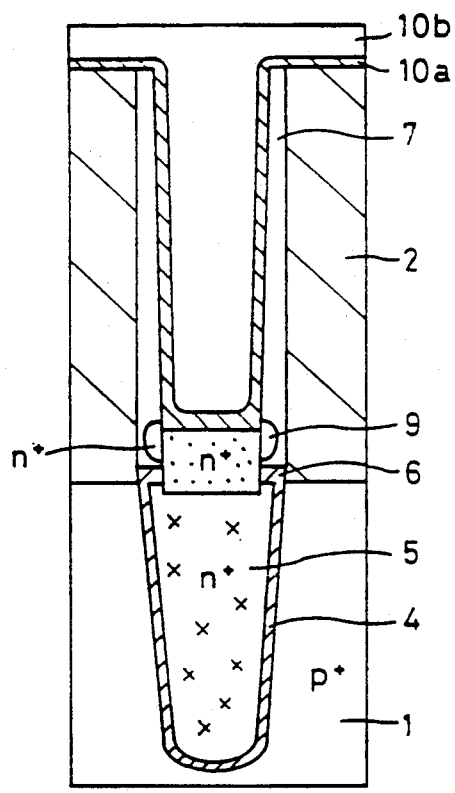
Figure 16B:
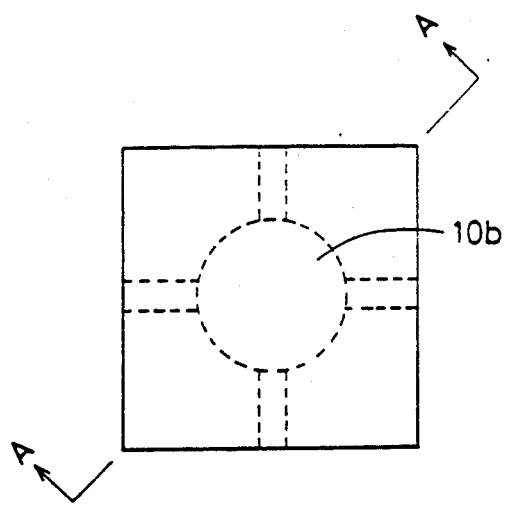
Figure 18A:
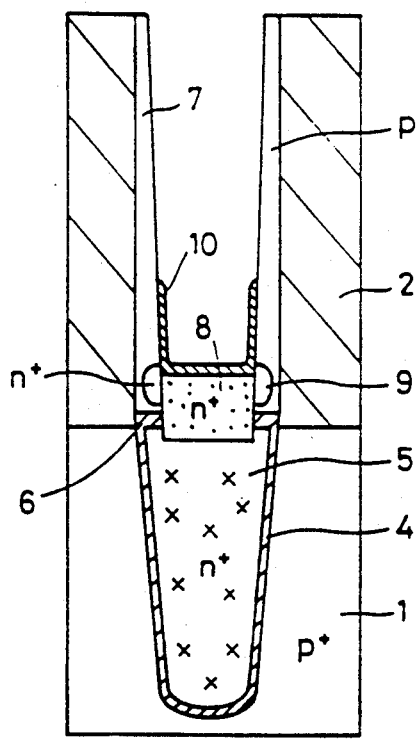
Figure 18B:
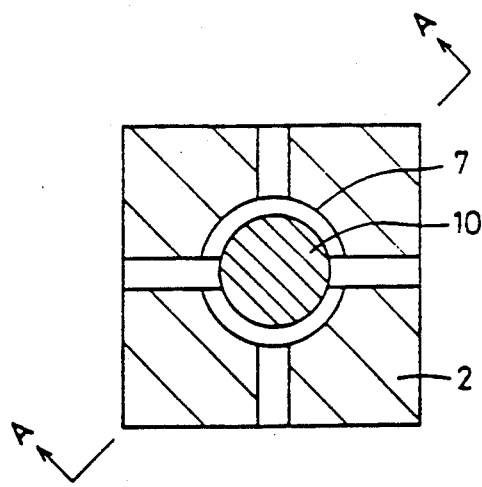

With reference to FIGS. 16(A) and 16(B), after the formation of the silicon oxide film 10a over the whole surface through thermal oxidation, a resist 10b is applied to fill all the grooves. Thereafter, by controlling a etching time period, the resist 10b is etched back to a predetermined position as shown in FIGS. 17(A) and 17(B). The silicon oxide film 10a is selectively removed and the resist 10b is removed to form a gate insulating film 10 as shown in FIGS. 18(A) and 18(B).

Since the foregoing manufacturing steps are for forming films only in a trench, all the patterns to be used have a hole shape corresponding to all the trenches 3. Accordingly, the films are formed in self-alignment manner with respect to the trench patterns.

Figure 19A:
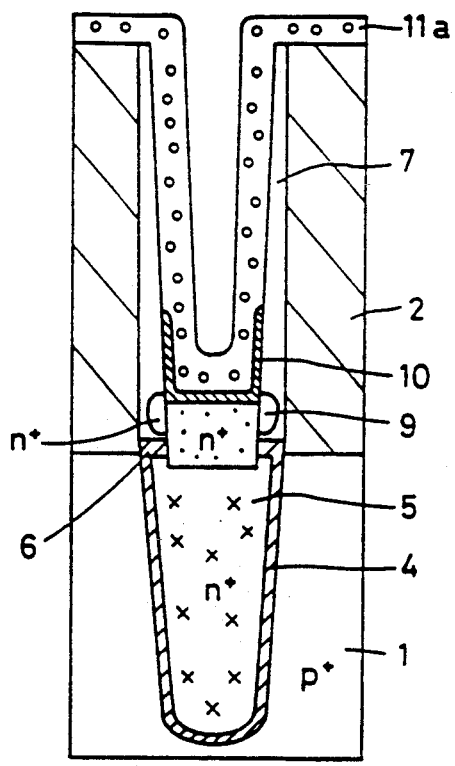
Figure 19B:
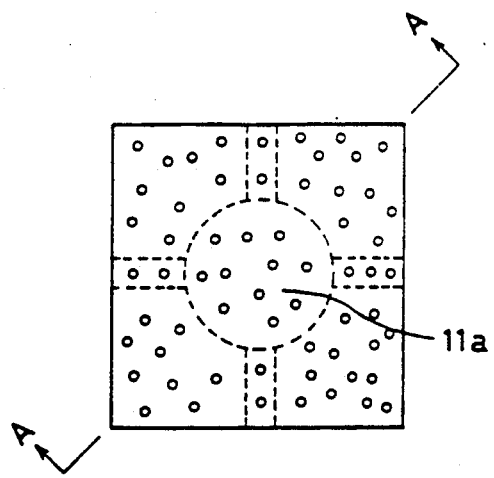
Figure 20A:
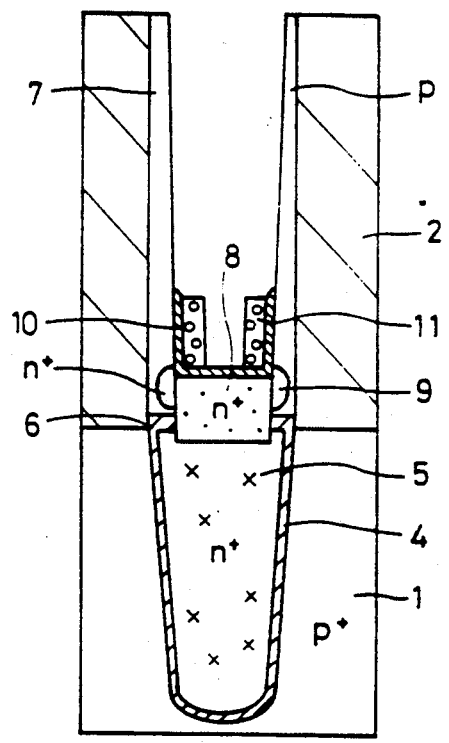
Figure 20B:
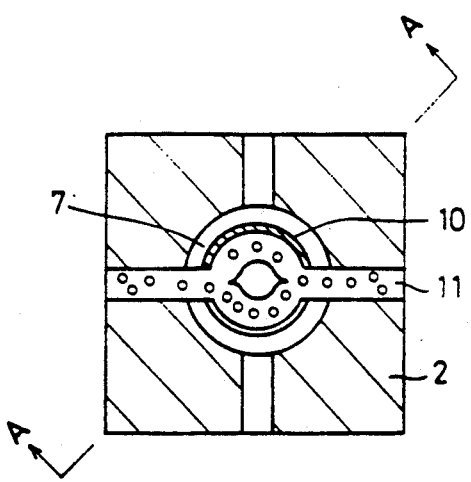

Now, with reference to FIGS. 19(A) and 19(B), a conductive layer 11a including metal or the like is formed over the whole surface. With reference to FIGS. 20(A) and 20(B), the conductive layer 11a is removed by anisotropic etching to form a gate electrode 11 on the gate insulating film 10. As shown in FIG. 18(B), only a portion of the p type semiconductor layer 7 corresponding to the direction of the word lines is removed by etching using a predetermined mask before the formation of the conductive layer 11a. As shown in FIG. 20(B), a word line 11 is formed by using a mask in accordance with a predetermined word line pattern.

Figure 22A:
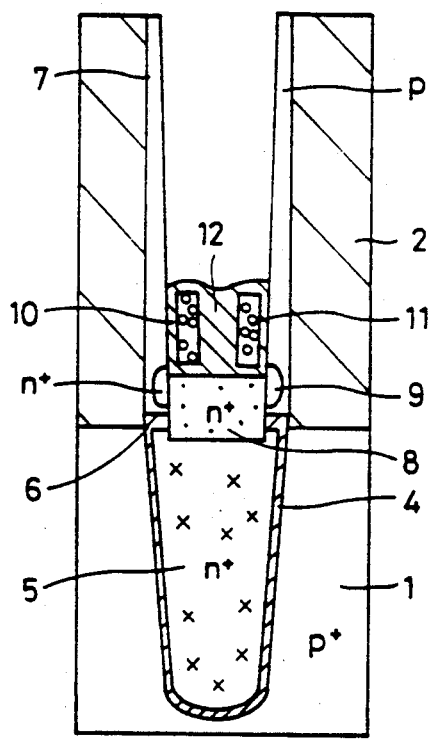
Figure 22B:
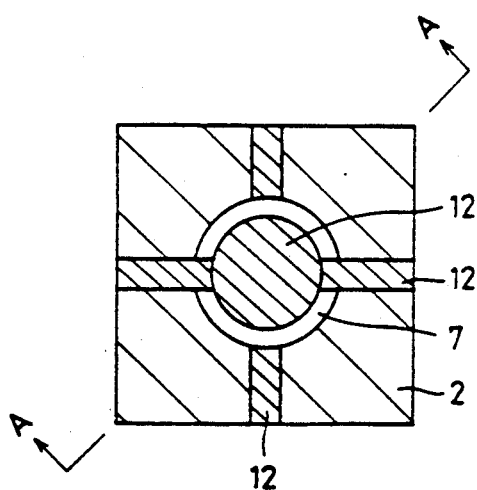
Figure 24A:
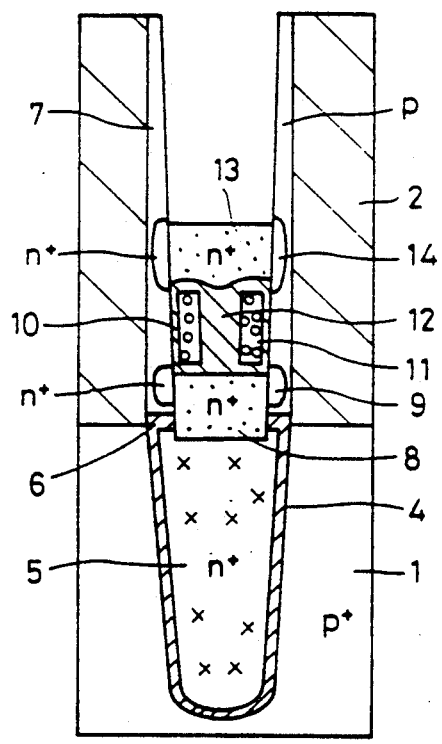
Figure 24B:
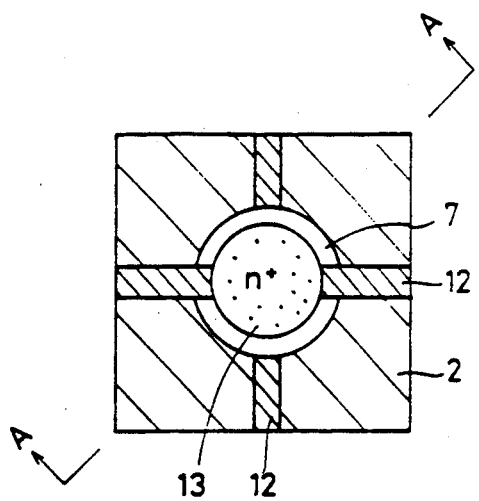

With reference to FIGS. 21(A) and 21(B), after a silicon oxide film 12a is formed over the whole surface to cover the gate electrode 11 by a CVD method, an insulating film 12 is formed by etching such as reactive ion etching as shown in FIGS. 22(A) and 22(B).

With reference to FIGS. 23(A), 23(B), 24(A) and 24(B), an n+ layer 13 and an n+ impurity region 14 are formed out of an n+ layer 13a in the same manner as in the formation of the n+ layer 8 and the n impurity region 9.

Figure 26A:
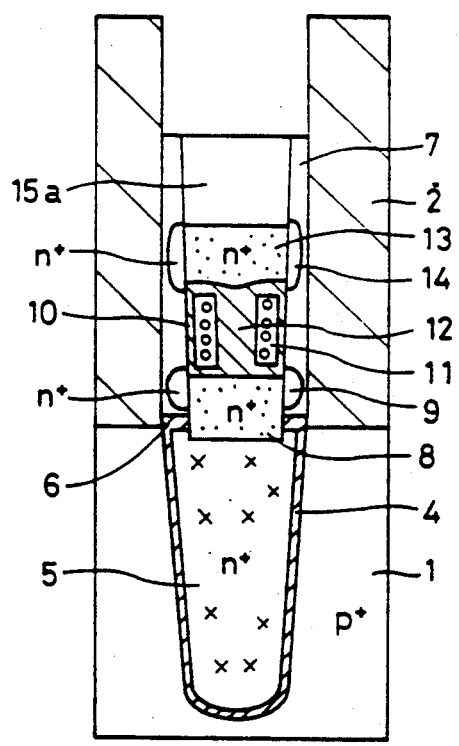
Figure 26B:
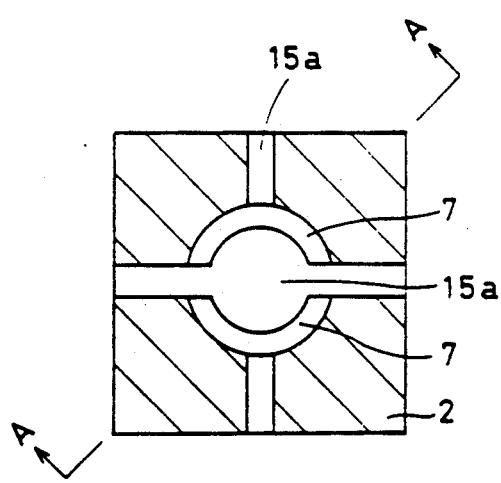
Figure 27A:
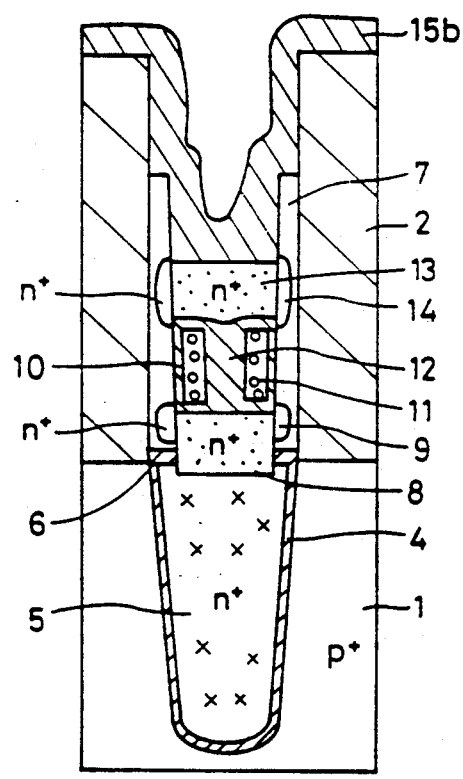
Figure 27B:
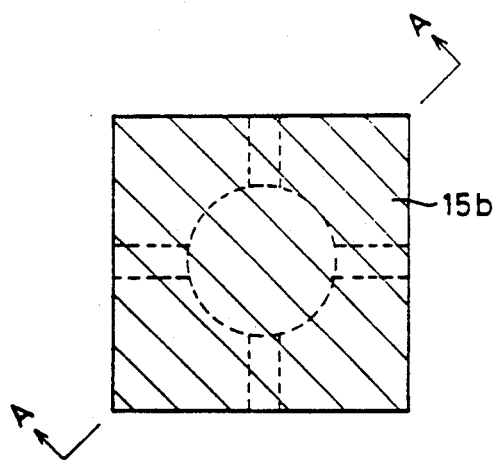
Figure 28A:
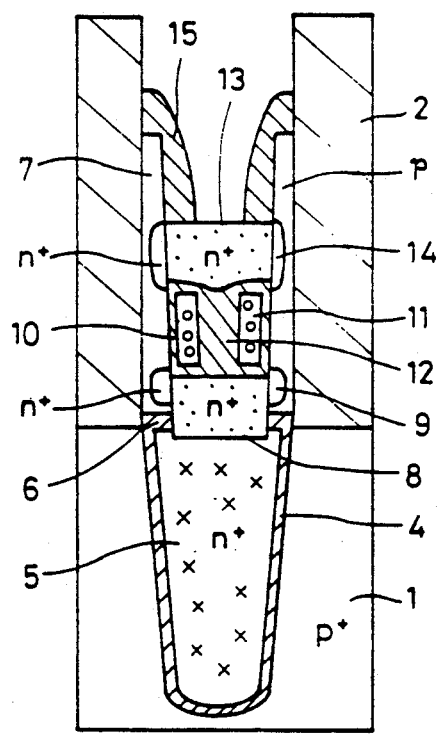
Figure 28B:
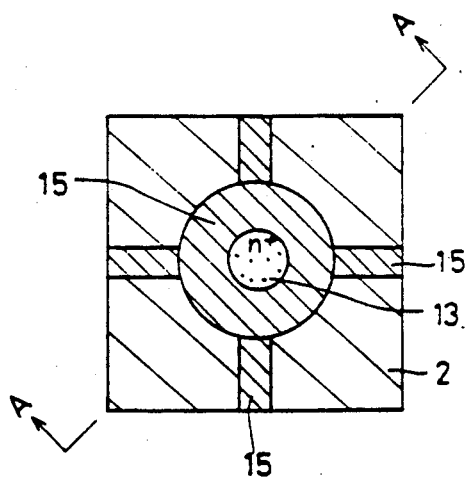

With reference to FIGS. 25(A) and 25(B), after a resist 15a is formed over the whole surface, the upper surface of the p type semiconductor layer 7 is etched back from the surface of the insulating film 2 through etching back by the anisotropic etching technique as shown in FIGS. 26(A) and 26(B). Then, after the removal of the resist 15a, a silicon oxide film 15b is formed over the whole surface by a CVD method as shown in FIGS. 27(A) and 27(B) and then, it is selectively removed by reactive ion etching as shown in FIGS. 28(A) and 28(B) to form a silicon oxide film 15.

Figure 29A:
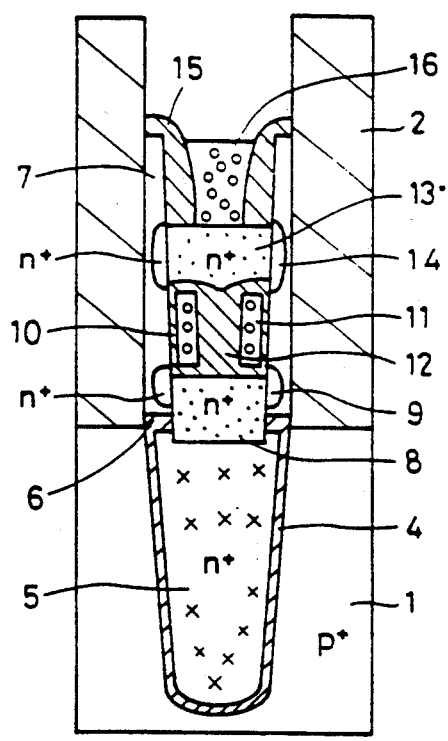
Figure 29B:
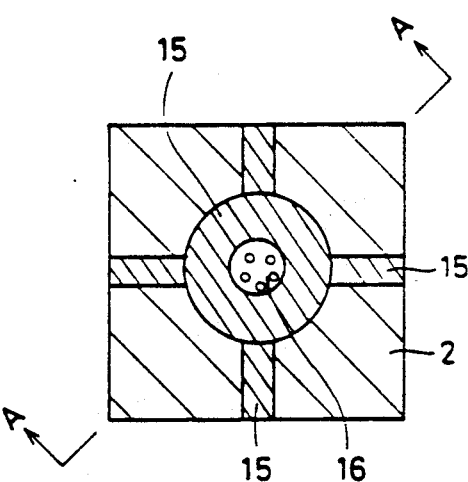

Referring to FIGS. 29(A)(B), a tungsten plug layer 16 as an interconnect layer is formed on the n+ layer 13 by the selective CVD method. A polysilicon layer may be used in place of tungsten as a material of interconnect layer.

Figure 30A:
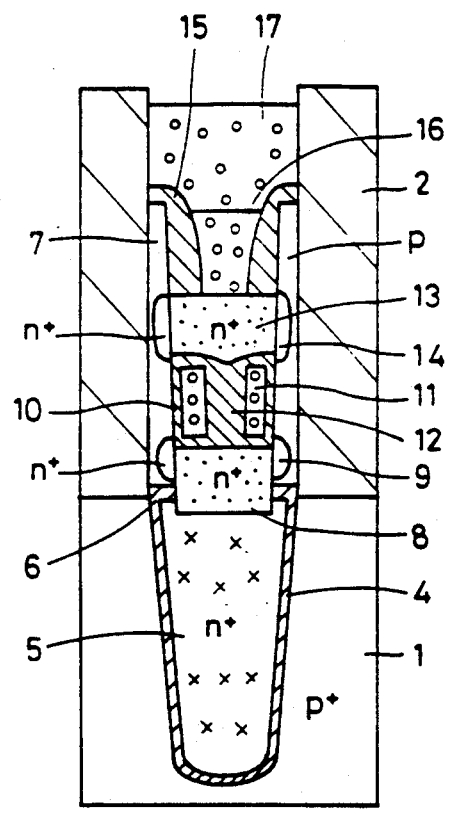
Figure 30B:
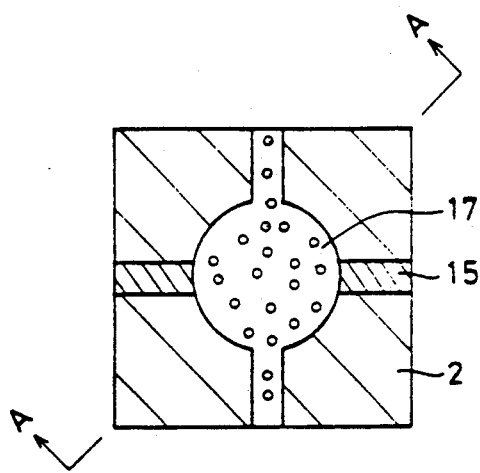

Referring to FIGS. 30(A)(B), a bit line 17 formed of tungsten or the like is formed on the tungsten plug layer 16.

As the foregoing, all the elements of a memory cell are formed in the trench and the word lines and the bit lines are also formed in the trench.

Figure 31A:
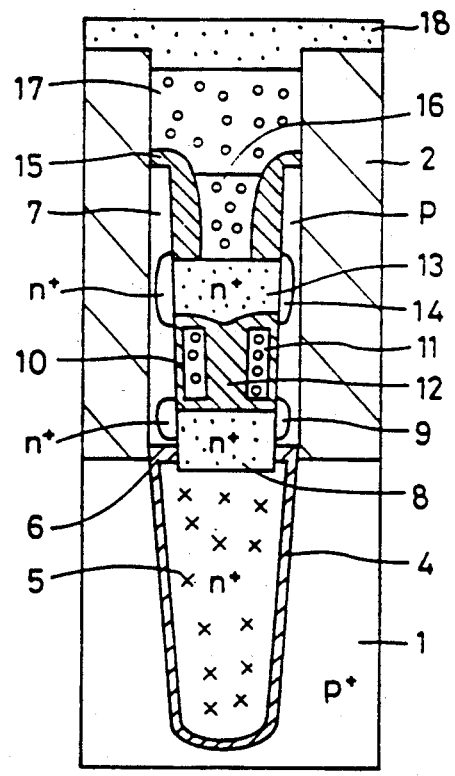
Figure 31B:
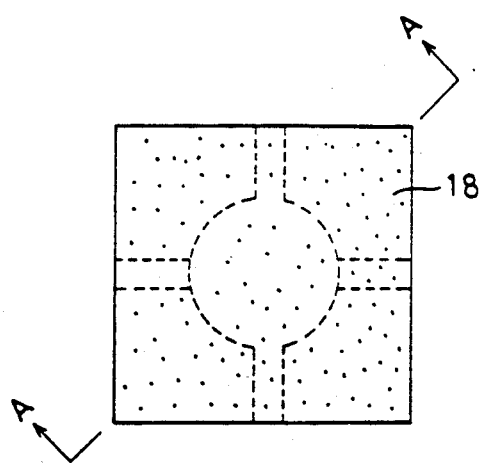

Referring to FIGS. 31(A)(B), a passivation film 18 is formed over the whole surface.

While the p+ silicon substrate 1 is used as a cell plate of a capacitor, the cell plate may be formed of a doped polysilicon layer formed on the silicon substrate 1. In addition, a p+ epitaxial layer or an n epitaxial layer may be used in place of the p+ silicon substrate 1. Materials of an interconnection layer and an electrode layer such as a storage node, a bit line and an interconnect layer are not limited thereto and any material formed of a conductive layer may be used.

Another embodiment of a DRAM memory cell according to the present invention will be described. FIGS. 32-51 are sectional views and plan views showing sequential steps of a memory cell manufacturing method according to another embodiment.

With reference to FIGS. 32(A)(B), a trench 3 is formed by selectively removing an insulating film 2 and a p+ silicon substrate 1 by reactive ion etching. Thereafter, a nitride film 4 is formed on the bottom wall and sidewall surfaces of the silicon substrate 1 and on the insulating film 2.

Figure 33A:
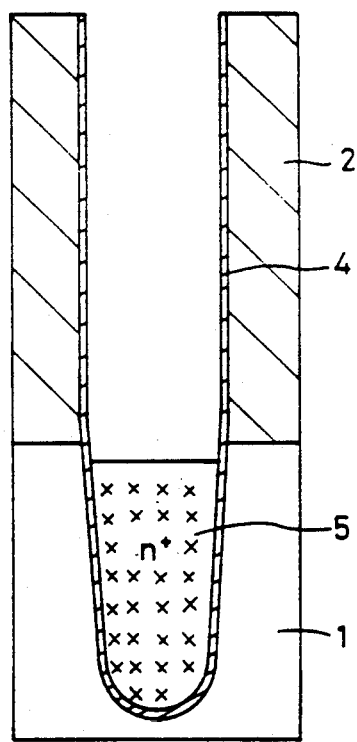
Figure 33B:
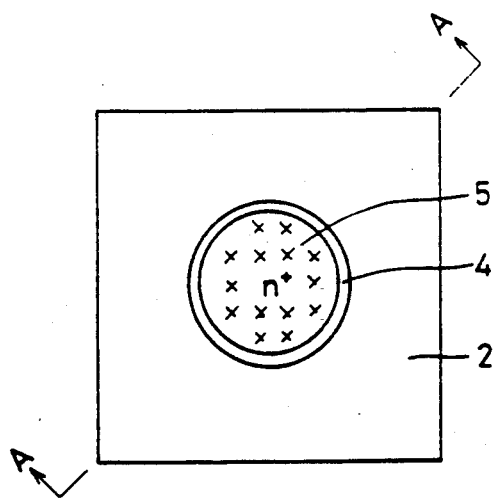

With reference to FIGS. 33(A)(B), a phosphorus doped polysilicon layer formed over the whole surface is selectively removed by an anisotropic etching technique such as reactive ion etching to form an n+ polysilicon layer 5 as a storage node on the surface of the nitride film 4 on the p type silicon substrate 1.

Figure 34A:
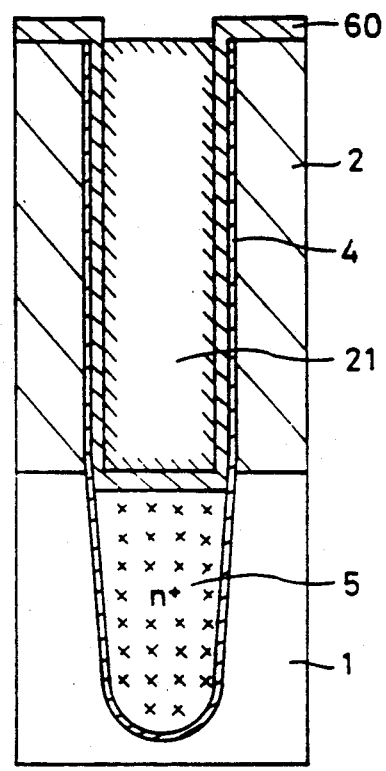
Figure 34B:
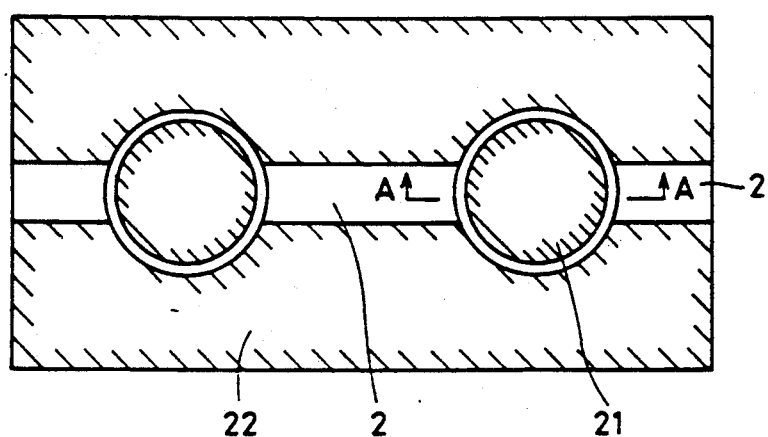

With reference to FIGS. 34(A)(B), a silicon oxide film 60 is formed over the whole surface by a CVD method. Thereafter, a first resist 21 is formed to fill the trench. Then, a second resist 22 is formed which is patterned such that only a portion at which a word line is formed exposes its surface. The insulating film 2 at the portion in which a word line is formed is selectively removed to a predetermined depth by using these resists 21 and 22 as masks.

Figure 35A:
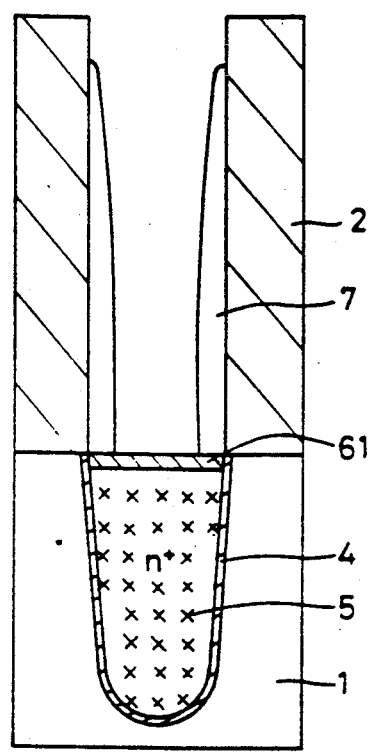
Figure 35B:
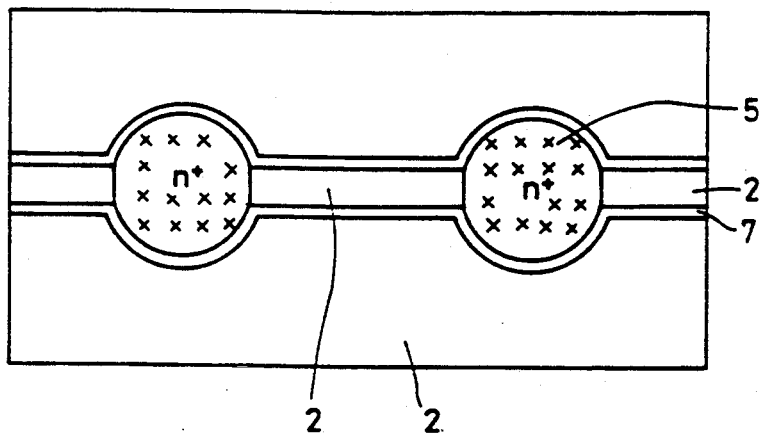
Figure 36:
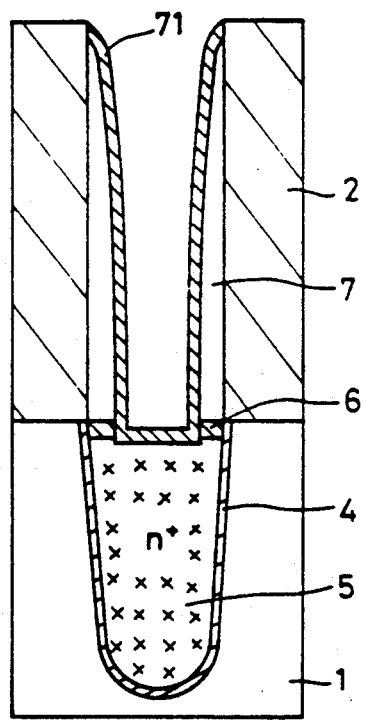

After the removal of the resists 21 and 22, a non-doped polysilicon layer is formed over the whole surface. This polysilicon layer is selectively removed by anisotropic etching to be left only on the sidewall of the insulating film 2. This polysilicon layer is recrystallized through a thermal process such as laser annealing and lamp annealing, resulting in a formation of a semiconductor layer 7 as shown in FIGS. 35(A)(B). As shown in FIG. 36, an opening portion is formed in the insulating film 6 in a self-alignment manner such that the n+ polysilicon layer 5 exposes its surface by selectively removing a silicon oxide film 61 by isotropic etching. Thereafter, a thin silicon oxide film 71 is formed on the semiconductor layer 7.

Figure 37A:
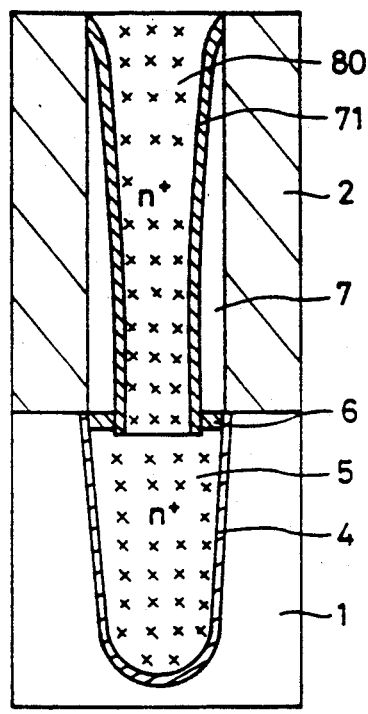
Figure 37B:
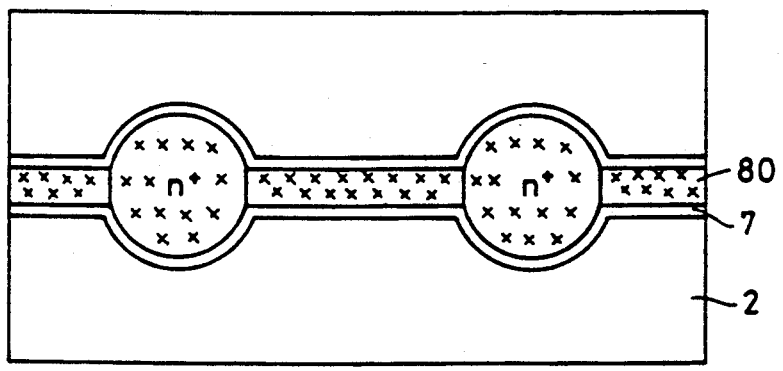
Figure 38A:
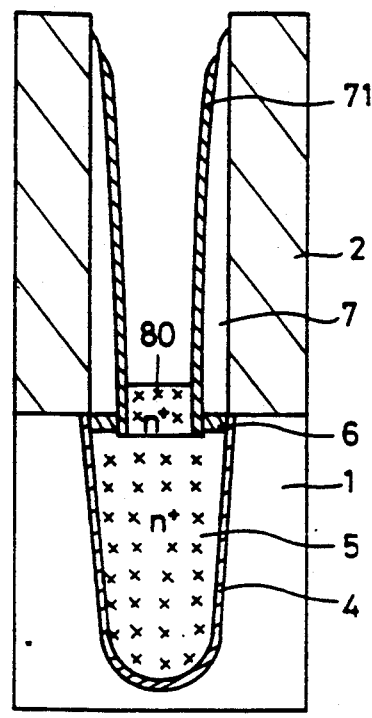
Figure 38B:
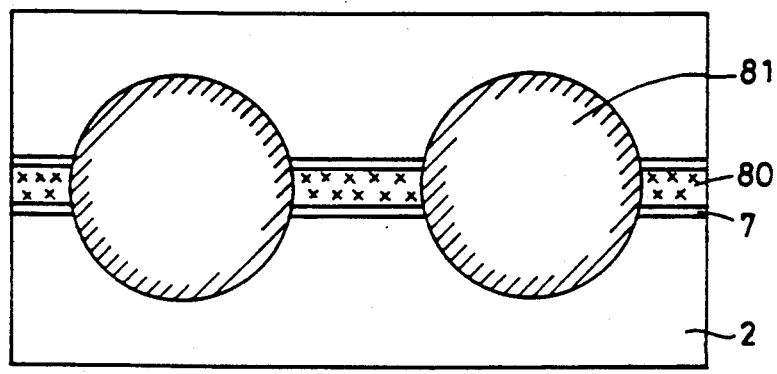
Figure 38C:
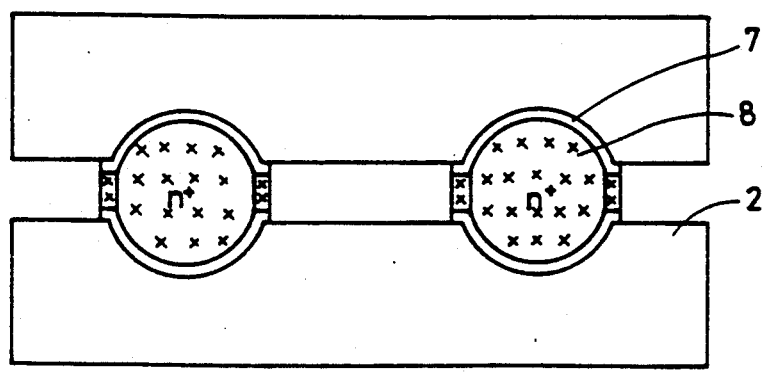

As shown in FIGS. 37(A)(B), a phosphorous doped polysilicon layer 80 is formed to fill all the grooves. Thereafter, a part of the phosphorous doped polysilicon layer 80 is removed all over to a predetermined level by isotropic etching as shown in FIG. 38(A). Then, as shown in FIG. 38(B), a resist 81 is formed only in the cylindrical trench portion in which the memory cell is to be formed. The semiconductor layer 7 and the doped polysilicon layer 80 located in the groove wherein the word line is to be formed are removed through anisotropic etching by using the resist 81 as a mask (see FIG. 38(C)). As a result, the semiconductor layer 7 and the doped polysilicon layer 8 are left only in the potion of the cylindrical trench.

Figure 39:
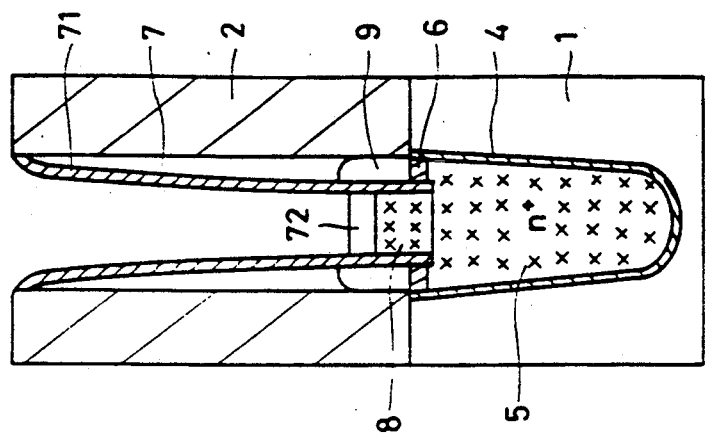
Figure 40:
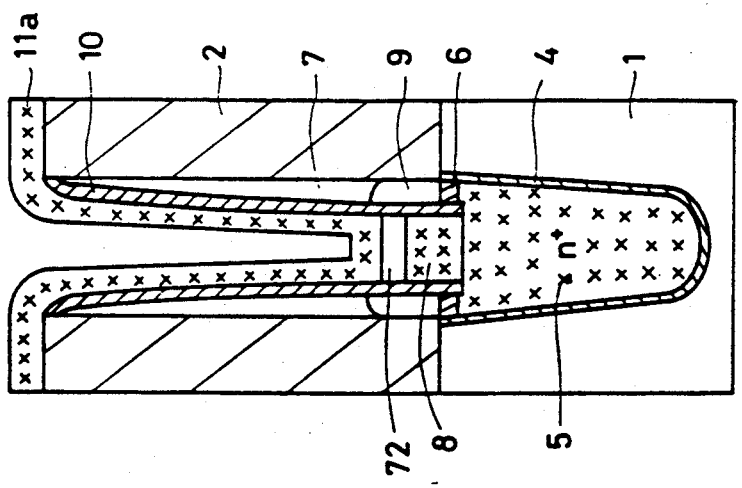

As shown in FIG. 39, the doped polysilicon layer 8 is subjected to an anneal process to cause phosphorous to diffuse through a silicon oxide film 71 into the semiconductor layer 7. As a result, an n+ impurity diffusion region 9 and a silicon oxide film 72 are formed. Thereafter, the thin silicon oxide film 71 is removed as shown in FIG. 40. A gate insulating film 10 of a silicon oxide film is again formed on the semiconductor layer 7. Then, a phosphorous doped polysilicon layer 11a is formed over the whole surface.

Figure 41:
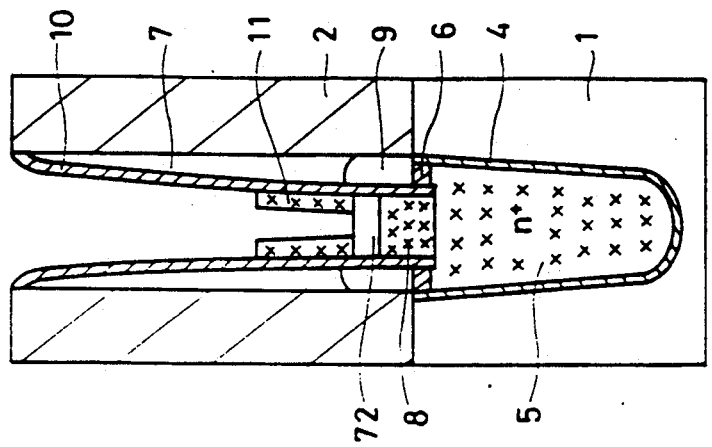
Figure 42:
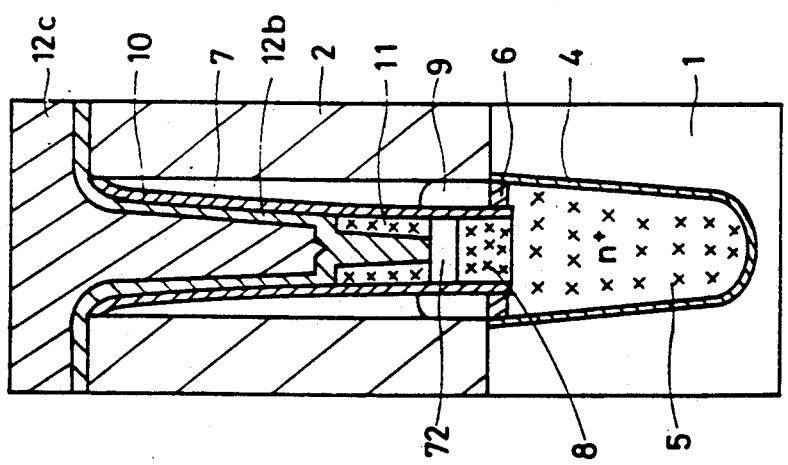

As shown in FIG. 41, a gate electrode 11 is formed by removing the doped polysilicon layer 11a through anisotropic etching. As shown in FIG. 42, a silicon nitride film 12b is formed over the whole surface. A silicon oxide film 12c is formed on the silicon nitride film 12b. At this time, the memory cell array region is flattened by the silicon oxide film 12c.

Figure 43A:
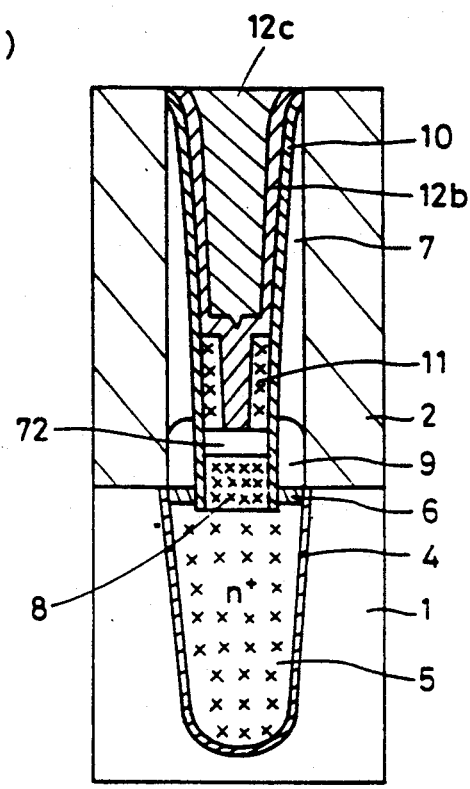
Figure 43B:
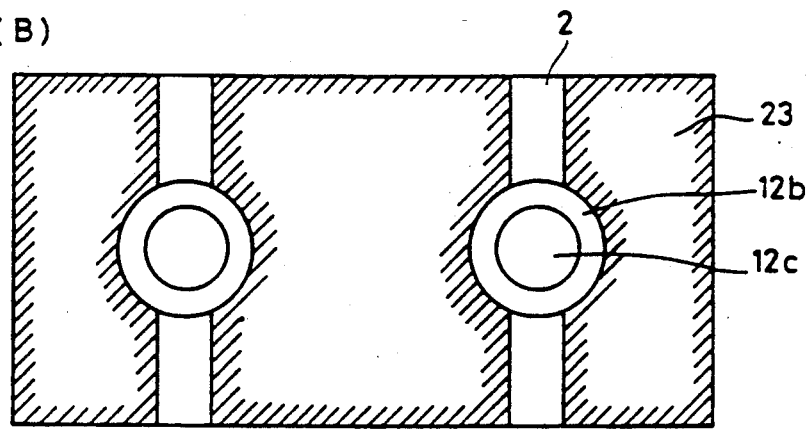

With reference to FIGS. 43(A)(B), a resist 23 is formed which is patterned to expose only a bit line formation region. The silicon oxide film 12c is first removed to the level of the upper surface of the insulating film 2 by using the resist 23 as a mask. Then, the silicon nitride film 12b is wet-etched by using phosphoric acid so as to expose the surface of the insulating film 2 in the bit line formation region. Thereafter, the insulating film 2 at the bit line formation region and the silicon oxide film 12c at the memory cell formation region are etched by using the resist 23 as a mask.

Figure 44:
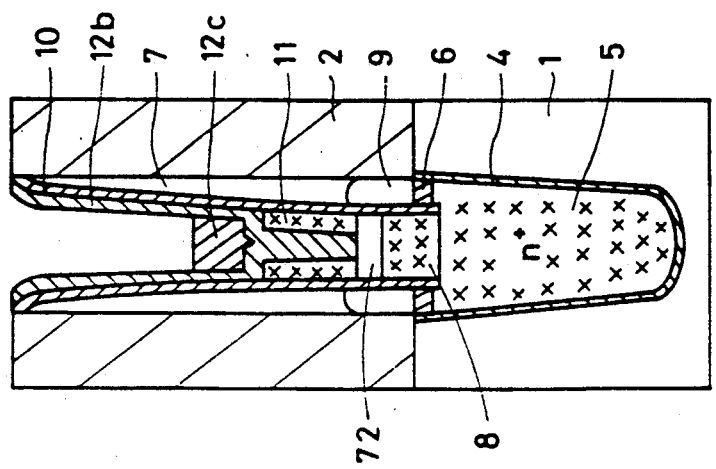
Figure 45:
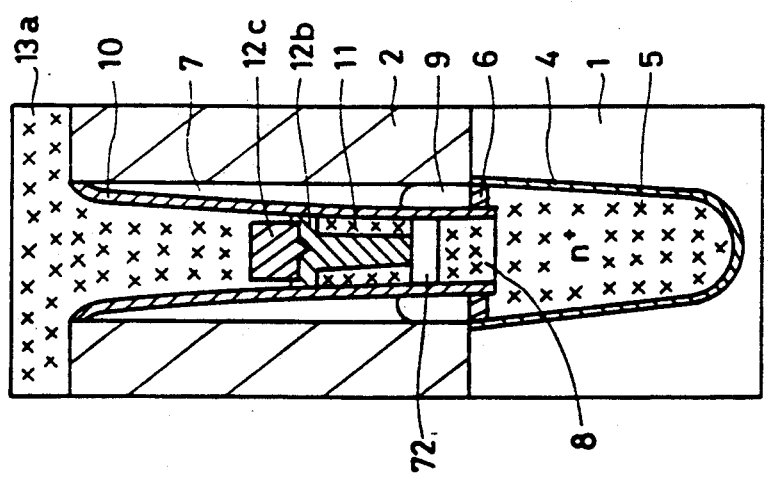

As a result, the surface of the silicon oxide film 12c is etched back as shown in FIG. 44. Thereafter, the silicon nitride film 12b is selectively removed by using phosphoric acid or the like after the removal of the resist 23. As shown in FIG. 45, a phosphorous doped polysilicon layer 13a is formed over the whole surface.

Figure 46:
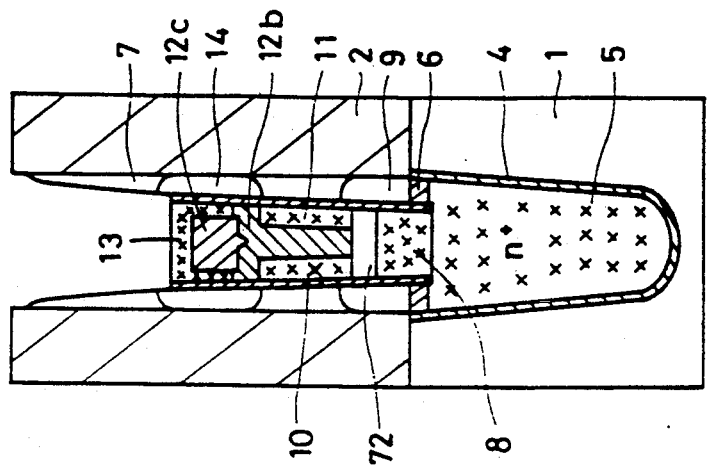
Figure 47:
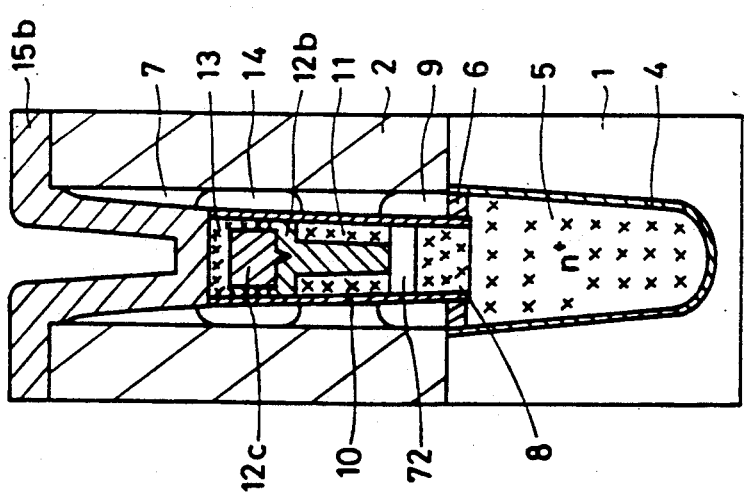

As shown in FIG. 46, the polysilicon layer 13a is etched back through isotropic etching to leave a doped polysilicon layer 13. Thereafter, a thermal process causes phosphorous to diffuse through the gate oxide film 10 into the semiconductor layer 7. As a result, an n+ impurity diffusion region 14 is formed. With reference to FIG. 47, a silicon oxide film 15b is formed over the whole surface.

Figure 48:
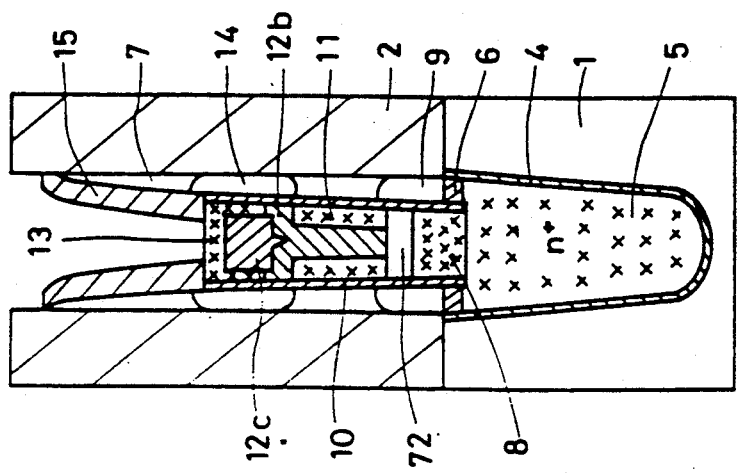
Figure 49:
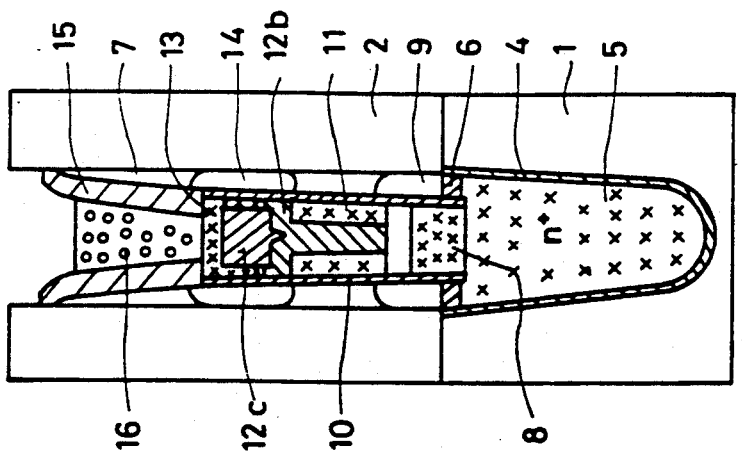

With reference to FIG. 48, a silicon oxide film 15b is selectively removed through reactive ion etching to form a silicon oxide film 15. As shown in FIG. 49, a tungsten plug layer 16 as an interconnect layer is formed on the doped polysilicon layer 13 by a selective CVD method. At this time, the tungsten plug layer 16 may be left only the doped polysilicon layer 13 through etching back after the formation of the tungsten layer over the whole surface.

Figure 50:
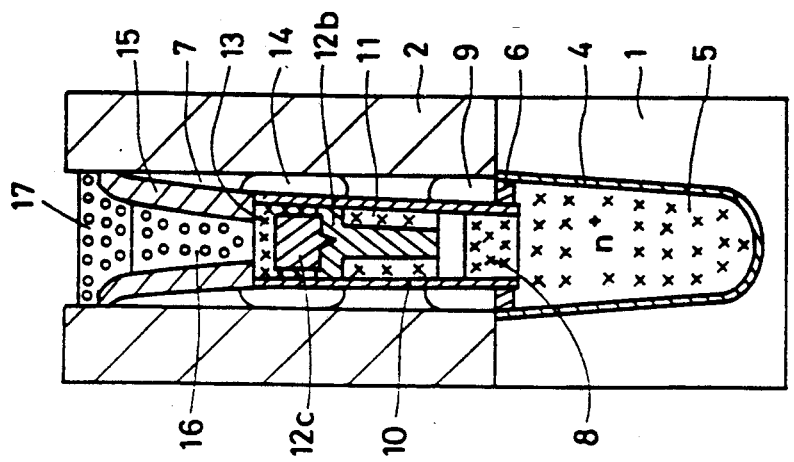
Figure 51:
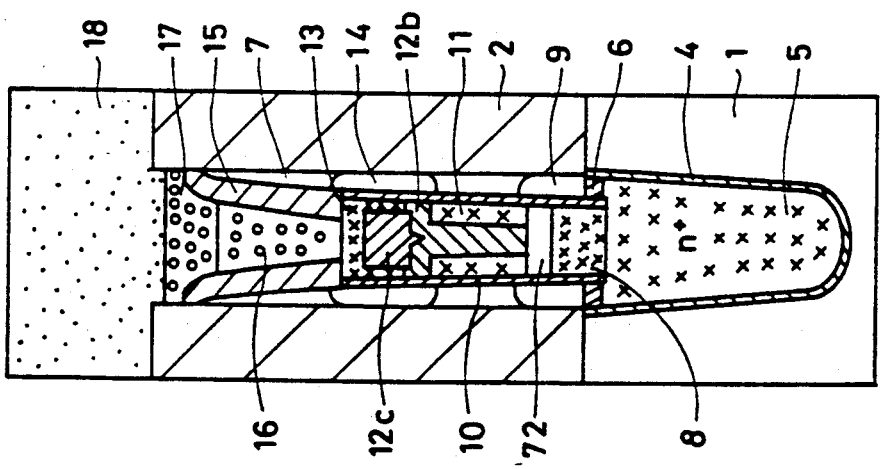
Figure 52:
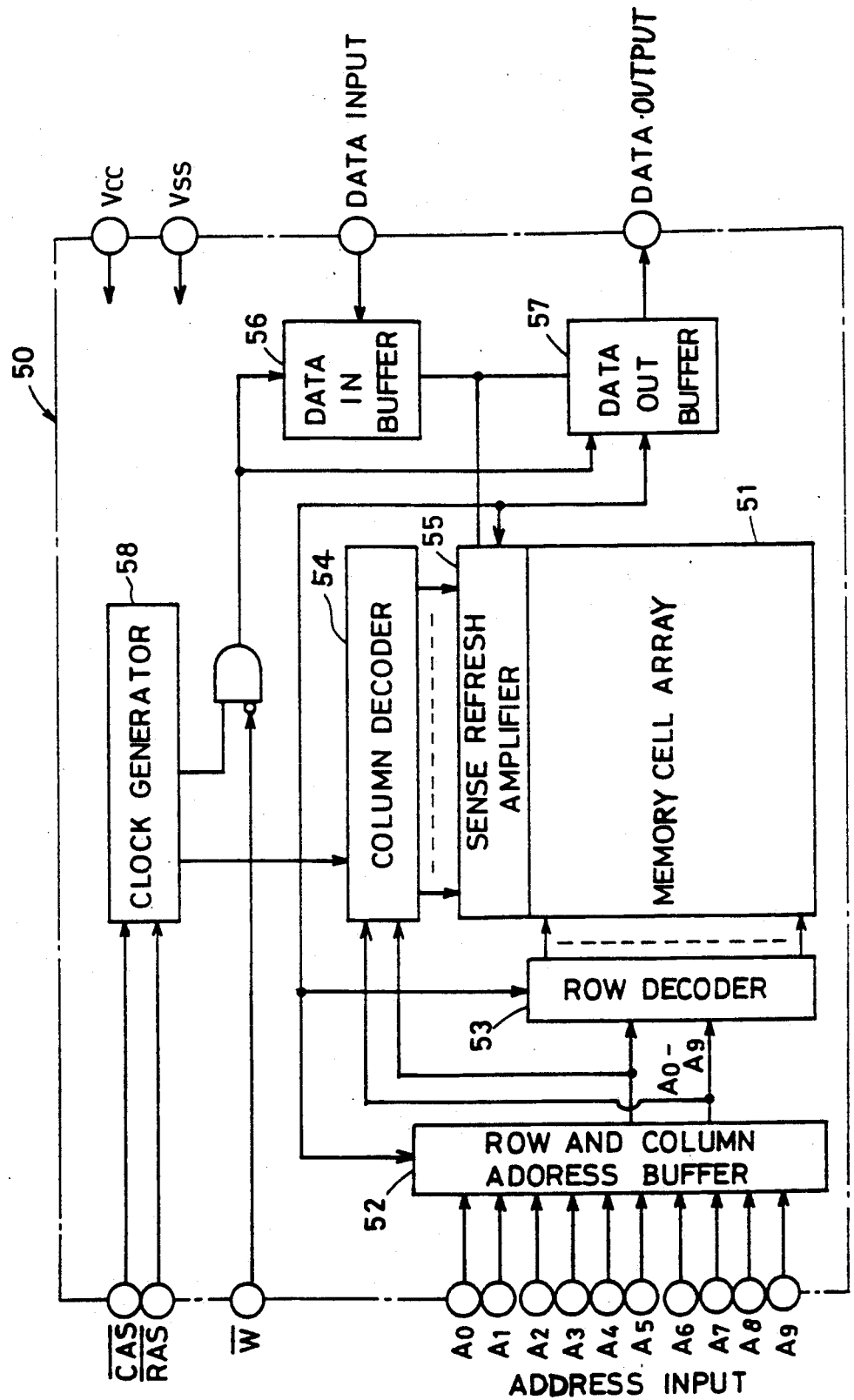
FIG. 52 is a block diagram showing an entire arrangement of a conventional dynamic random access memory (DRAM).
Figure 53:
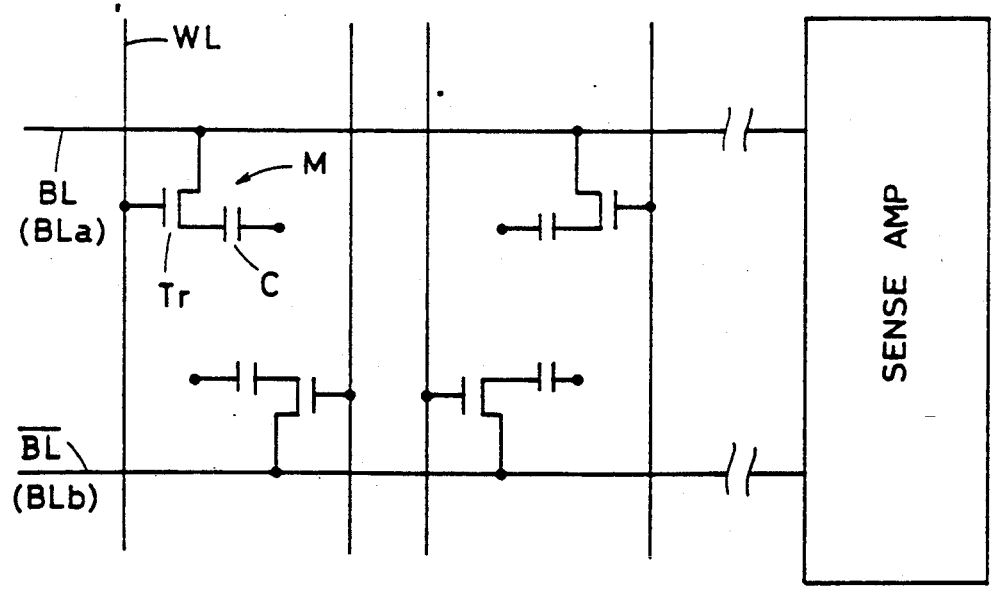
FIG. 53 is an equivalent circuit diagram showing a sense amplifier and a memory cells of four bits of a memory cell array of the DRAM shown in FIG. 52.

As shown in FIG. 50, a bit line 17 of tungsten or the like is formed on the tungsten plug layer 16. Lastly with reference to FIG. 51, a passivation film 18 is formed over the whole surface.

As the foregoing, according to the present invention, formation of all the elements constituting a memory cell of a semiconductor memory device in a trench enables a fine element isolation without the formation of a parasitic MOS transistor. In addition, it is possible to miniaturize a memory cell without forming a transistor having an extremely short channel length and it is possible to form a capacitor of a large capacitance depending on a depth of the trench. Furthermore, in a manufacturing method of a memory cell, all the films can be formed in a self-alignment manner only by registering a mask with a corresponding pattern of a trench to be formed, so that a margin required for registering the masks without misalignments is not extremely reduced along with the miniaturization of the memory cell. A memory cell which can be easily miniaturized and has high reliability can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a memory cell formed in a trench, comprising:
   a semiconductor substrate of a first conductivity type and having a major surface,
   an insulating layer covering a portion of said major surface,
   a trench in said substrate and insulating layer extending from said major surface and having a sidewall including an upper portion and a lower portion and a bottom wall,
   the upper portion of said sidewall being formed of said insulating layer, the bottom wall and the lower portion of said sidewall being formed of said semiconductor substrate,
   a capacitor and a field effect transistor buried in said trench,
   said capacitor including
   (a) a first electrode formed in said semiconductor substrate,
   (b) a dielectric film formed on a surface of said trench so as to be in contact with said first electrode, and
   (c) a second electrode formed on said dielectric film, said field effect transistor including
   (a) a semiconductor layer of the first conductivity type formed on the upper portion of said sidewall so as to be separated from said second electrode and the major surface of said substrate,
   (b) a gate electrode formed, through an insulating film, on a sidewall surface of said semiconductor layer,
   (c) first and second impurity regions of a second conductivity type formed in said semiconductor layer with said gate electrode provided therebetween,
   a first connecting conductive layer provided between said second electrode and said first impurity region, insulated from said gate electrode, so as to electrically connect said first impurity region with said second electrode, and
   a second connecting conductive layer insulated from said semiconductor layer and formed above said gate electrode in said trench to provide electrical connection with said second impurity region, with second connecting conductive layer being insulated from said gate electrode.

2. A semiconductor memory device according to claim 1, wherein said second electrode includes a conductive layer of the second conductivity type filling the trench portion formed by said bottom wall and said lower portion formed of said semiconductor substrate.

3. A semiconductor memory device according to claim 1, wherein said first connecting conductive layer includes a conductive layer of the second conductivity type.

4. A semiconductor memory device according to claim 1, wherein said second connecting conductive layer includes a conductive layer of the second conductivity type.

5. A semiconductor memory device according to claim 1, wherein said gate electrode includes a rough cylinder-shaped conductive layer portion having an outer peripheral portion near the side surface of said semiconductor layer.

6. A semiconductor memory device according to claim 1, wherein said gate electrode includes a rough column-shaped conductive layer portion having an outer peripheral portion near the sidewall surface of said semiconductor layer.

7. A dynamic random access memory, comprising:
   a semiconductor substrate of a first conductivity type having a major surface,
   an insulation layer formed on the major surface of said semiconductor substrate,
   said semiconductor substrate and said insulation layer having a plurality of trenches, said trench extending from said major surface and having a bottom wall formed of said semiconductor substrate and a sidewall including a lower portion formed of said semiconductor substrate and an upper portion formed of said insulation layer,
   a plurality of word lines formed on said major surface so as to be insulated from said semiconductor substrate and extending in a first direction,
   a plurality of bit lines formed on said word lines and extending in a second direction intersecting with said first direction,
   a plurality of memory cells arranged at intersecting portions between said word lines and said bit lines, each of said memory cells including a capacitor and a field effect transistor buried in said trench,
   said capacitor including:
   a first electrode formed in said semiconductor substrate,
   a dielectric film in contact with said first electrode and formed on said bottom wall and said sidewall portion formed of said semiconductor substrate,
   a second electrode formed on said dielectric film, said field effect transistor including:
   a semiconductor sidewall layer of the first conductivity type formed on said sidewall portion formed of said insulation layer so as to be separated from said second electrode,
   a gate electrode formed on a side surface of said semiconductor sidewall layer in said trench with an insulating film interposed therebetween and connected to said word line,
   first and second impurity regions of a second conductivity type formed in said semiconductor sidewall layer with said gate electrode provided therebetween,
   a first connecting conductive layer provided between said second electrode and said first impurity region, insulated from said gate electrode, so as to electrically connect said first impurity region with said second electrode,
   said bit lines each including an interconnection layer portion formed above said gate electrode in said trench, insulated from said semiconductor sidewall layer,
   a second connecting conductive layer provided between said second impurity region and said interconnection layer portion, insulated from said gate electrode, so as to electrically connect said second impurity region with said interconnection layer portion.

* * * * *